United States Patent
Ueda et al.

(10) Patent No.: US 9,412,765 B2
(45) Date of Patent: Aug. 9, 2016

(54) THIN FILM TRANSISTOR, MANUFACTURING METHOD OF SAME, AND DISPLAY DEVICE

(71) Applicant: Kabushiki Kaisha Toshiba, Tokyo (JP)

(72) Inventors: Tomomasa Ueda, Kanagawa-ken (JP); Shintaro Nakano, Kanagawa-ken (JP); Nobuyoshi Saito, Kanagawa-ken (JP); Kentaro Miura, Kanagawa-ken (JP); Yujiro Hara, Kanagawa-ken (JP); Hajime Yamaguchi, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 105 days.

(21) Appl. No.: 14/171,331

(22) Filed: Feb. 3, 2014

(65) Prior Publication Data

US 2014/0147948 A1    May 29, 2014

Related U.S. Application Data

(62) Division of application No. 13/238,331, filed on Sep. 21, 2011, now abandoned.

(30) Foreign Application Priority Data

Mar. 2, 2011    (JP) .................. 2011-045567

(51) Int. Cl.
*H01L 27/12*    (2006.01)
*H01L 29/66*    (2006.01)
(Continued)

(52) U.S. Cl.
CPC ...... *H01L 27/1225* (2013.01); *H01L 29/66969* (2013.01); *H01L 29/7869* (2013.01); *H01L 29/78606* (2013.01)

(58) Field of Classification Search
CPC ............. H01L 27/1225; H01L 29/78606; H01L 29/7869; H01L 29/66969

USPC ........ 438/29, 104; 257/43, E21.412, E33.053
See application file for complete search history.

(56) References Cited

U.S. PATENT DOCUMENTS 5,644,147 A    7/1997    Yamazaki et al.
6,573,195 B1    6/2003    Yamazaki et al.
(Continued)

FOREIGN PATENT DOCUMENTS

CN    101710592 A    5/2010
CN    101794823 A    8/2010
(Continued)

OTHER PUBLICATIONS

Korean Office Action Issued Apr. 25, 2013 in Patent Application No. 10-2011-0096355 (with English translation).
(Continued)

*Primary Examiner* — Ori Nadav
*Assistant Examiner* — Ernest Allen, III
(74) *Attorney, Agent, or Firm* — Oblon, McClelland, Maier & Neustadt, L.L.P.

(57) ABSTRACT

According to one embodiment, a thin film transistor includes: a substrate; a semiconductor layer; first and second insulating films; and gate, source and drain electrodes. The semiconductor layer is provided on the substrate. The semiconductor layer is made of an oxide having indium. The semiconductor layer has first and second regions and other region. The first insulating film covers a top face of the other region. The second insulating film covers at least a pair of side surfaces of the semiconductor layer. The second insulating film is formed under a condition different from that for the first insulating film. The gate electrode is provided on the first and second insulating films or below the semiconductor layer. The source and drain electrodes are provided on the first and second regions, respectively. The drain and source electrodes sandwich the pair of the side surfaces of the semiconductor layer.

7 Claims, 15 Drawing Sheets

(51) Int. Cl.
*H01L 29/786* (2006.01)
*H01L 33/08* (2010.01)
*H01L 21/336* (2006.01)

(56) References Cited

U.S. PATENT DOCUMENTS

| | | |
|---|---|---|
| 7,385,579 B2 | 6/2008 | Satake |
| 7,977,675 B2 | 7/2011 | Kawamura et al. |
| 2002/0074936 A1* | 6/2002 | Yamazaki ............ H01L 27/3246 313/504 |
| 2002/0190256 A1 | 12/2002 | Murakami et al. |
| 2003/0151119 A1* | 8/2003 | Sakama .............. H01L 27/1248 257/640 |
| 2005/0270447 A1 | 12/2005 | Tasaka et al. |
| 2006/0113543 A1 | 6/2006 | Yamazaki et al. |
| 2007/0085112 A1 | 4/2007 | Yamazaki et al. |
| 2007/0120471 A1 | 5/2007 | Yamazaki et al. |
| 2007/0187678 A1 | 8/2007 | Hirao et al. |
| 2007/0295966 A1 | 12/2007 | Watanabe et al. |
| 2008/0197350 A1 | 8/2008 | Park et al. |
| 2008/0284929 A1 | 11/2008 | Kimura |
| 2010/0025675 A1 | 2/2010 | Yamazaki et al. |
| 2010/0032668 A1 | 2/2010 | Yamazaki et al. |
| 2010/0035379 A1 | 2/2010 | Miyairi et al. |
| 2010/0045919 A1 | 2/2010 | Chida et al. |
| 2010/0065844 A1* | 3/2010 | Tokunaga ......... H01L 29/78606 257/43 |
| 2010/0127266 A1 | 5/2010 | Saito et al. |
| 2010/0163866 A1* | 7/2010 | Akimoto ........... H01L 29/78606 257/43 |
| 2010/0193772 A1* | 8/2010 | Morosawa .......... H01L 29/7869 257/40 |
| 2010/0233847 A1 | 9/2010 | Ohara et al. |
| 2011/0008931 A1 | 1/2011 | Yamazaki et al. |
| 2011/0031490 A1 | 2/2011 | Wang et al. |
| 2011/0053322 A1 | 3/2011 | Sasaki et al. |
| 2011/0095288 A1 | 4/2011 | Morosawa et al. |
| 2011/0193071 A1 | 8/2011 | Yahagi |

FOREIGN PATENT DOCUMENTS

| | | |
|---|---|---|
| JP | 2007-73559 | 3/2007 |
| JP | 2010-16163 | 1/2010 |
| JP | 2010-56546 | 3/2010 |
| JP | 2010-123748 | 6/2010 |
| JP | 2011-29630 | 2/2011 |
| KR | 2003-0058164 | 7/2003 |
| KR | 10-2010-0094275 | 8/2010 |
| KR | 1020100094275 A | 8/2010 |
| TW | 201017774 A1 | 5/2010 |

OTHER PUBLICATIONS

Korean Office Action issued Oct. 19, 2012, in Korea Patent Application No. 10-2011-0096355 (with English translation).
Tsukada, Toshihisda TFT/LCD: Liquid-Crystal Displays Addressed by Thin-Film Transistors (Japanese Technology Reviews, vol. 29) Gordon & Breach, Amsterdam, 1996 ISBN 2-919875-01-9 Chapter 3, pp. 89-95.
Taiwanese Office Action issued Jan. 16, 2015, in Taiwan Patent Application No. 100134625 (with English translation).
Combined Office Action and Search Report issued Jan. 24, 2014 in Chinese Patent Application No. 201110287707.1 with English language translation.
Chinese Office Action issued Mar. 30, 2015 in Patent Application No. 201110287707.1 with English Translation.
Office Action issued May 29, 2015 in Taiwanese Patent Application No. 100134625 (with English language translation).
Office Action issued Sep. 17, 2014 in Chinese Patent Application No. 201110287707.1 (with English translation).
Japanese Office Action issued Oct. 24, 2014, in Japan Patent Application No. 2011-045567 (with English translation).
Office Action issued Mar. 3, 2015 in Japanese Patent Application No. 2011-045567 (with English language translation).
Office Action issued Sep. 16, 2015 in Taiwanese Patent Application No. 100134625 (with English language translation).
Chinese Office Action issued Oct. 12, 2015 in Patent Application No. 201110287707.1 (with English language translation).

* cited by examiner

| Condition | SiH₄ flow rate | N₂O flow rate | Pressure | Power | Substrate Temperature | film forming rate |
|---|---|---|---|---|---|---|
| C-1 | 10sccm | 500sccm | 150Pa | 200W | 160°C | 50nm/min |
| C-2 | 5sccm | 500sccm | 150Pa | 200W | 160°C | 25nm/min |
| C-3 | 2sccm | 500sccm | 150Pa | 200W | 160°C | 10nm/min |

THIN FILM TRANSISTOR, MANUFACTURING METHOD OF SAME, AND DISPLAY DEVICE

CROSS-REFERENCE TO RELATED APPLICATIONS

This application is based upon and claims the benefit of priority from the prior Japanese Patent Application No. 2011-045567, filed on Mar. 2, 2011; the entire contents of which are incorporated herein by reference.

FIELD

Embodiments described herein relate generally to a thin film transistor, a manufacturing method of the same, and a display device.

BACKGROUND

Thin film transistors (TFTs) are widely used in a liquid crystal display device, an organic electroluminescent display device, or the like. Particularly, TFTs using amorphous silicon for an active layer are now widely used in large-sized liquid crystal display devices. It is desired to implement a novel active layer that can meet further upsizing, higher reliability, higher mobility, and so on in future.

In—Ga—Zn—O amorphous oxides, for example, can be formed on a plastic substrate because the oxides can be formed in a film at low temperature, and the oxides are transparent in a visible wave range. Thus, it is likely to implement a transparent TFT using the oxides for a semiconductor layer. This TFT obtains the mobility ten times the mobility of amorphous silicon or more. Problems of practical application are to further improve uniformity and reliability.

For a method for improving reliability, there is proposed a technique that prevents a phenomenon in which heat treatment causes the oxygen concentration of a semiconductor layer to change, resulting in deterioration of the characteristics. This technique stabilizes the characteristics by covering a semiconductor layer with a good quality insulating layer (a channel protective film).

However, in this configuration, in the process of processing a semiconductor layer before forming a channel protective film, at least the upper layer of the semiconductor layer is subjected to cleaning with water, and the semiconductor layer absolves moisture. The oxide semiconductor tends to take moisture in the film because of the characteristics, so that it is necessary to control moisture in the film.

DETAILED DESCRIPTION

Figure 1:
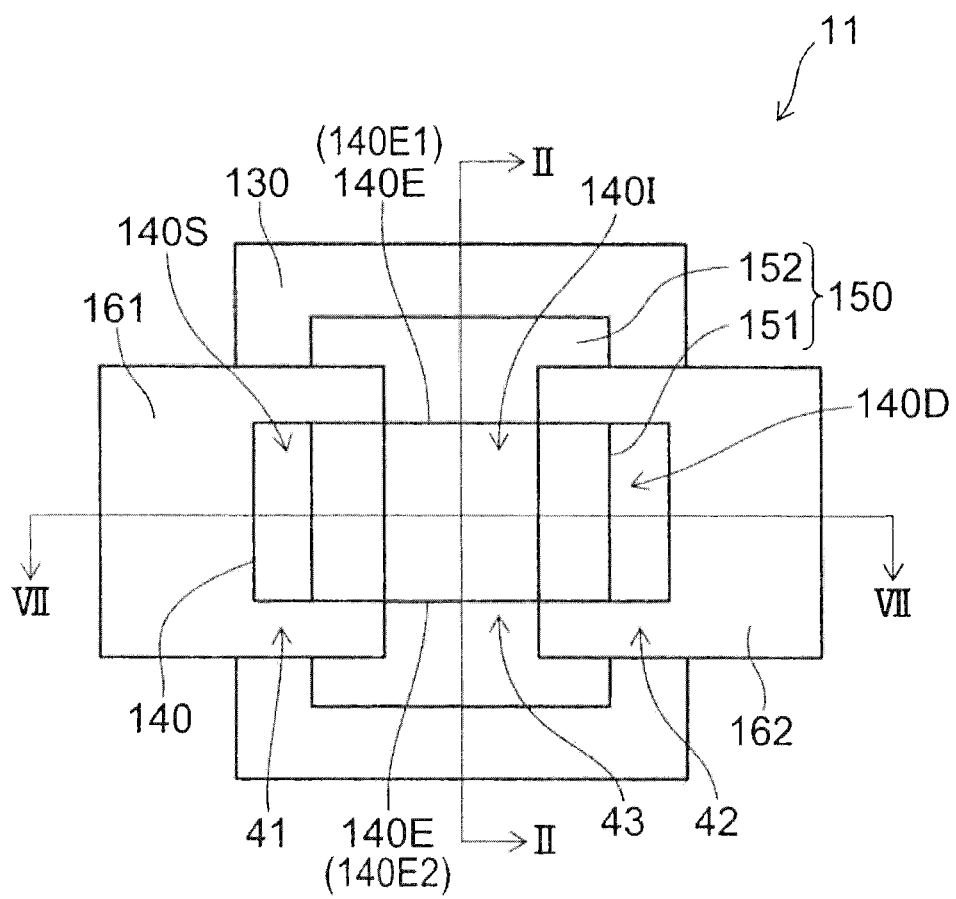
FIG. 1 is a schematic view illustrating a thin film transistor according to a first embodiment.

In general, according to one embodiment, a thin film transistor includes: a substrate, a semiconductor layer, a first insulating film, a second insulating film, a gate electrode, a source electrode, and a drain electrode. The semiconductor layer is provided on the substrate. The semiconductor layer is made of an oxide having indium for a main component. The semiconductor layer has a top face facing the substrate and a pair of side face. The top face has a first region, a second region, and an other region except the first region and the second region. The first insulating film covers the other region of the semiconductor layer. The second insulating film covers at least the pair of side surfaces of the semiconductor layer. The second insulating film is formed under a condition different from a condition for the first insulating film. The gate electrode is provided on the first insulating film and the second insulating film or provided below the semiconductor layer. The source electrode is provided on the first region. The drain electrode is provided on the second region. The drain electrode faces the source electrode. The drain electrode and the source electrode sandwiches the pair of the side surfaces of the semiconductor layer.

According to another embodiment, a manufacturing method for a thin film transistor is disclosed. The method can process. The processing includes: forming a semiconductor layer made of an oxide having indium for a main component on a gate electrode on a substrate via a gate insulating layer, forming a first insulating film on a top face except a source electrode contact region and a drain electrode contact region of the semiconductor layer, and forming a second insulating film covering at least a pair of side surfaces of the semiconductor layer under a condition different from a condition for the first insulating film; or forming a semiconductor layer made of an oxide having indium for a main component on a substrate, forming a first insulating film on a top face except a source electrode contact region and a drain electrode contact region of the semiconductor layer, forming a second insulating film covering at least a pair of side surfaces of the semiconductor layer under a condition different from a condition for the first insulating film, and forming a gate electrode on the second insulating film. The method can form a source electrode on the source electrode contact region of the semiconductor layer. In addition, the method can form a drain electrode on the drain electrode contact region of the semiconductor layer so as to face the source electrode to sandwich a part of the side surfaces of the semiconductor layer.

According to another embodiment, a display device includes a thin film transistor and a display layer. The thin film transistor includes a substrate, a semiconductor layer, a first insulating film, a second insulating film, a gate electrode, a source electrode, and a drain electrode. The semiconductor layer is provided on the substrate. The semiconductor layer is made of an oxide having indium for a main component. The semiconductor layer has a top face facing the substrate and a pair of side face. The top face has a first region, a second region, and an other region except the first region and the second region. The first insulating film covers the other region of the semiconductor layer. The second insulating film covers at least the pair of side surfaces of the semiconductor layer. The second insulating film is formed under a condition different from a condition for the first insulating film. The gate electrode is provided on the first insulating film and the second insulating film or below the semiconductor layer. The source electrode is provided on the first region. The drain electrode is provided on the second region. The drain electrode faces the source electrode. The drain electrode and the source electrode sandwiches the pair of the side surfaces of the semiconductor layer. The display layer is configured to cause at least one of optical emission and a change in an optical property including at least one of birefringence, optical activity, scattering property, diffraction property, and optical absorption, according to at least one of a voltage and a current supplied through the thin film transistor.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic view illustrating the configuration of a bottom gate TFT according to a first embodiment.

Figure 2:
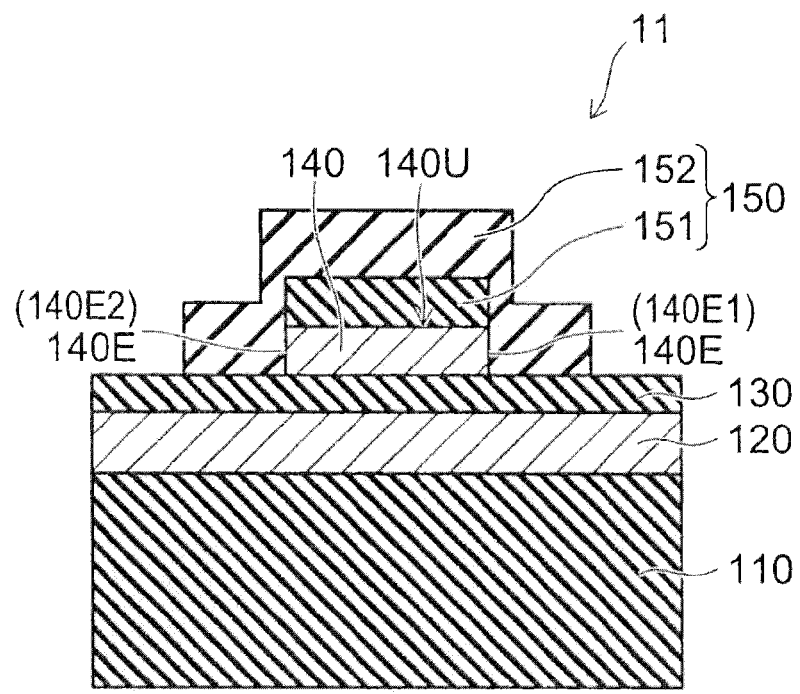
FIG. 2 is a diagram illustrating a cross section on line II-II shown in FIG. 1.

FIG. 2 is a diagram illustrating a cross section on line II-II shown in FIG. 1.

As illustrated in FIG. 1 and FIG. 2, a TFT 11 according to the first embodiment includes an insulating layer 110, a gate electrode 120 provided on the insulating layer 110, a gate insulating layer 130 covering the gate electrode 120, and a semiconductor layer 140 provided on the gate insulating layer 130. The TFT 11 includes a channel protective film 150 covering the semiconductor layer 140, and a source electrode 161 and a drain electrode 162 electrically connected to the semiconductor layer 140, the source electrode 161 and the drain electrode 162 being provided apart from each other so as to sandwich the gate electrode 120 therebetween.

The channel protective film 150 includes a first channel protective film 151 (a first insulating film), and a second channel protective film 152 (a second insulating film). The first channel protective film 151 covers the top face of the semiconductor layer 140 except a source electrode contact region 140S (a first region) and a drain electrode contact region 140D (a second region). The second channel protective film 152 covers at least a pair of edges 140E (the side surfaces) of the semiconductor layer 140. The pair of the edges 140E are positioned between the source electrode 161 and the drain electrode 162 of the semiconductor layer 140. In this example, the second channel protective film 152 further covers the first channel protective film 151 as well. The second channel protective film 152 has an oxidation state higher than the oxidation state of the first channel protective film 151.

For example, the oxygen concentration of the second insulating film (the second channel protective film 152) is higher than the oxygen concentration of the first insulating film (the first channel protective film 151).

As illustrated in FIG. 1 and FIG. 2, the thin film transistor 11 according to this embodiment includes a substrate 100, the semiconductor layer 140, the first insulating film (the first channel protective film 151, for example), the second insulating film (for example, the second channel protective film 152), the gate electrode 120, the first electrode (the source electrode 161, for example), and the second electrode (the drain electrode 162, for example).

The semiconductor layer 140 is provided on the substrate 100. The semiconductor layer 140 contains an oxide including indium. The semiconductor layer 140 has a first portion 41, a second portion 42, and a middle portion 43. The first portion 41 and the second portion 42 are provided on a plane in parallel with the major surface of the substrate 100. The middle portion 43 is provided between the first portion 41 and the second portion 42. The semiconductor layer 140 has a top face 140U, a first side face 140E1 of the middle portion 43, and a second side face 140E2 of the middle portion 43. The top face 140U includes the first region (the source electrode contact region 140S) on the first portion 41, the second region (the drain electrode contact region 140D) on the second portion 42, and an other region 140I except the first region and the second region. The second side face 140E2 and the first side face 140E1 are arranged side by side along a second direction vertical to a first direction from the first portion 41 toward the second portion 42, the first direction being in parallel with the aforementioned plane.

The first insulating film covers the other region 140I. The second insulating film covers at least the first side face 140E1 and the second side face 140E2. The second insulating film is formed under the conditions different from the conditions for the first insulating film. The gate electrode 120 faces the semiconductor layer 140. The first electrode is provided on the first region. The second electrode is provided on the second region.

Although the insulating layer 110 and the gate electrode 120 are not shown in FIG. 1, the insulating layer 110 and the gate electrode 120 are provided on the back of the gate insulating layer 130 on the paper. In FIG. 1, the position of the first channel protective film 151 and the position of the semiconductor layer 140 are indicated by broken lines.

The semiconductor layer 140 contains an oxide including indium and at least one of gallium (Ga), zinc (Zn), tin (Sn), and silicon (Si). Namely, the semiconductor layer 140 is an oxide film containing In, Ga, and Zn, for example, (i.e. an In—Ga—Zn—O oxide film). The semiconductor layer 140 may be an oxide film containing In and Zn (i.e. an In—Zn—O oxide film). The semiconductor layer 140 may be an oxide film containing In, Zn, and Si (i.e. an In—Zn—Si—O oxide film). In the following, In—Ga—Zn—O oxide films are generically called "an InGaZnO film". The InGaZnO film used below has In as a main component.

The insulating layer 110 can be formed on the substrate. A light transmitting glass substrate, a light transmitting plastic substrate, a composite substrate that a thin piece of glass (a thickness of 10 μm) is bonded to a plastic substrate, or the like, for example, can be used for the substrate. In addition to these, a light shielding substrate such as a substrate made of silicon or stainless steel may be used. Alternatively, an insulating substrate may be used as well for the insulating layer 110. In this embodiment, it is sufficient that the surface of the portion on which the gate electrode 120 is provided has insulating properties.

A high melting point metal such as MoW, Ta, and W, for example, can be used for the gate electrode 120. Hillock-free Al alloy or Cu of a lower resistance may be used. However, a given conductive material can be used for the gate electrode 120, not limited thereto.

For the gate insulating layer 130, an insulating material such as silicon oxide ($SiO_x$), silicon nitride ($SiN_x$), and silicon oxynitride, for example, can be used.

For the first channel protective film 151, an insulating material containing oxygen such as silicon oxide, for example, with acid resistance higher than the acid resistance of the semiconductor layer 140 can be used. Preferably, the interface between the semiconductor layer 140 and the first channel protective film 151 has good quality in order to obtain excellent characteristics in the TFT 11.

Silicon oxide or the like with acid resistance higher than the acid resistance of the semiconductor layer 140 is also used for the second channel protective film 152. An exemplary method for forming the second channel protective film 152 in a film with an oxidation state higher than the oxidation state of the first channel protective film 151 will be described later.

A given conductive material can be used for the source electrode 161 and the drain electrode 162. For example, a given conductive stacked film such as a Ti/Al/Ti film, Mo/Al/Mo film, or the like can be used.

It may be possible to provide a resin passivation film such as silicon oxide or polyimide, for example, so as to cover the TFT 11, in order to improve the durability of the TFT 11.

The TFT 11 particularly using In—Ga—Zn—O amorphous oxides among oxides for the semiconductor layer 140 is sensitive to moisture in the film.

The detailed study of the characteristics of the TFT revealed that the characteristics of the TFT greatly fluctuate according to the conditions of forming a $SiO_2$ film on an InGaZnO film by plasma enhanced chemical vapor deposition (PE-CVD) using $SiH_4$ gas and $N_2O$ gas. Thus, desirably, the first channel protective film 151 is formed under the film forming conditions optimized for developing excellent TFT characteristics.

However, it is revealed that in the case where a damaged portion and a moisture absorbed portion in the channel edges 140E or the like of the InGaZnO film are covered with a film formed under the optimized film forming conditions, a problem arises in that the resistance of the edges 140E is decreased and the threshold voltage of the TFT characteristics are negatively shifted. Although this problem can be improved by applying heat treatment at a temperature of 200° C. or more, for example, it is difficult to apply a sufficient heat treatment in the case of using a substrate of a poor heating resistance such as a plastic substrate.

However, it was revealed that the resistance of the edges 140E is not decreased by providing a film covering portions such as the edges 140E where the resistance tends to be decreased in such a way that the film forming conditions are changed as by decreasing the $SiH_4/N_2O$ gas ratio, for example.

It is estimated that the width (the distance) from the film ends of the edges 140E is 1 μm or less, even though the resistance of the edges 140E is increased, so that an effective decrease in the channel width can be generally ignored.

In this embodiment, it is possible that the first channel protective film 151 is formed on the semiconductor layer 140 under the conditions of optimizing the TFT characteristics and the semiconductor layer 140 is covered with the second channel protective film 152 formed under the conditions of increasing the resistance of the edges 140E of the semiconductor layer 140. Consequently, according to this embodiment, it is possible to obtain the TFT 11 of high reliability. The first channel protective film 151 and the second channel protective film 152 prevent water from penetrating the lower layer.

Figure 3:
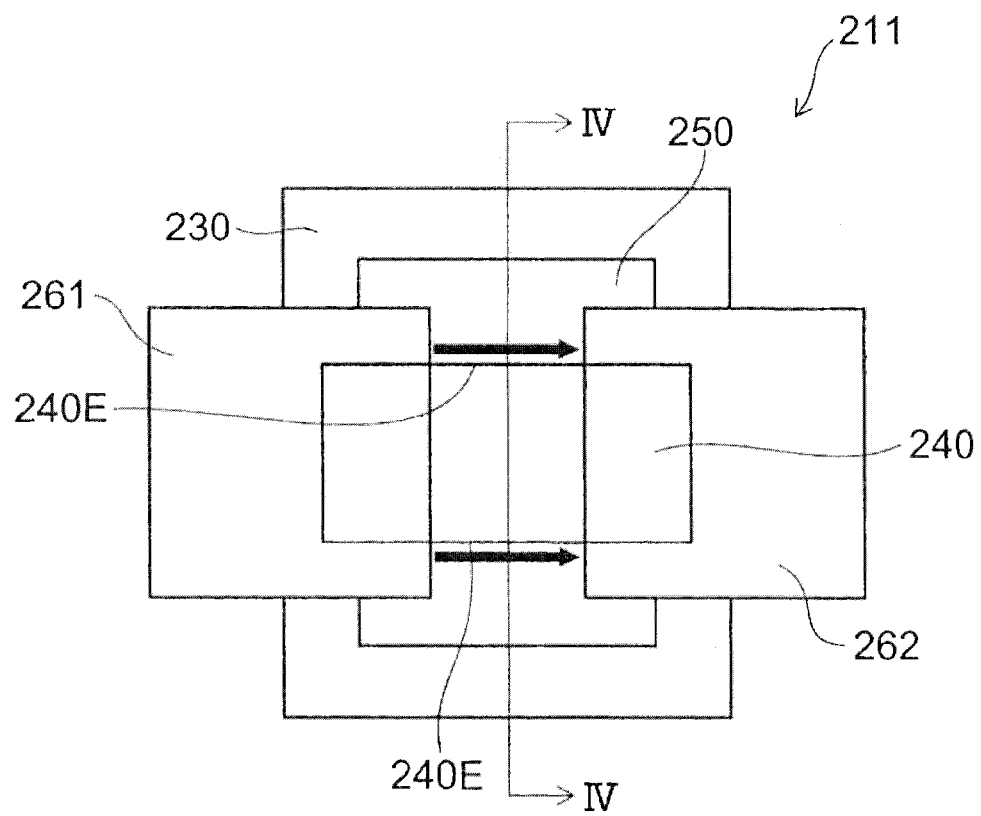
FIG. 3 is a schematic plane view illustrating a thin film transistor a comparative example.

FIG. 3 shows a plane view of a TFT 211 having another configuration for comparison.

Figure 4:
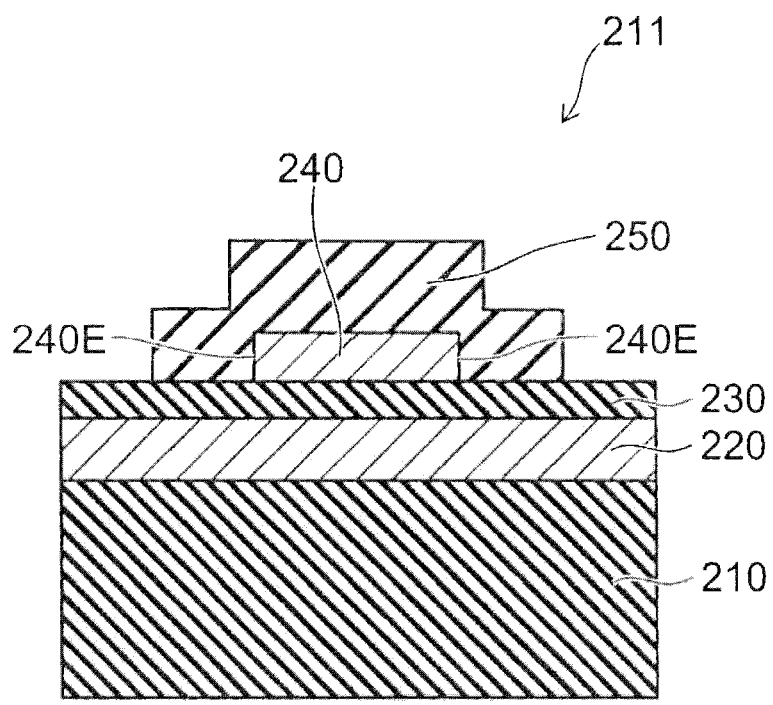
FIG. 4 is a diagram illustrating a cross section on line IV-IV shown in FIG. 3.

FIG. 4 shows a cross sectional view on line IV-IV shown in FIG. 3.

This TFT 211 includes an insulating layer 210, a gate electrode 220 provided on the insulating layer 210, a gate insulating layer 130 provided on the gate electrode 220, a semiconductor layer 240 provided on the gate insulating layer 130, a channel protective film 250 covering the top face and edges 240E of the semiconductor layer 240, and a source electrode 261 and a drain electrode 262 electrically connected to the semiconductor layer 240, the source electrode 261 and the drain electrode 262 being provided apart from each other so as to sandwich the gate electrode 220 therebetween.

Although the insulating layer 210 and the gate electrode 220 are not shown in FIG. 3, the insulating layer 210 and the gate electrode 220 are provided on the back of the gate insulating layer 230 on the paper. Although the semiconductor layer 240 is not shown as well in the drawing, the semiconductor layer 240 is provided on the back of the gate insulating layer 230 on the paper.

It was revealed this time in this TFT 211 that the resistance of the edges 240E of the InGaZnO film forming the semiconductor layer 240 is sometimes decreased to cause a leakage current indicated by arrows in FIG. 3.

Figure 5:
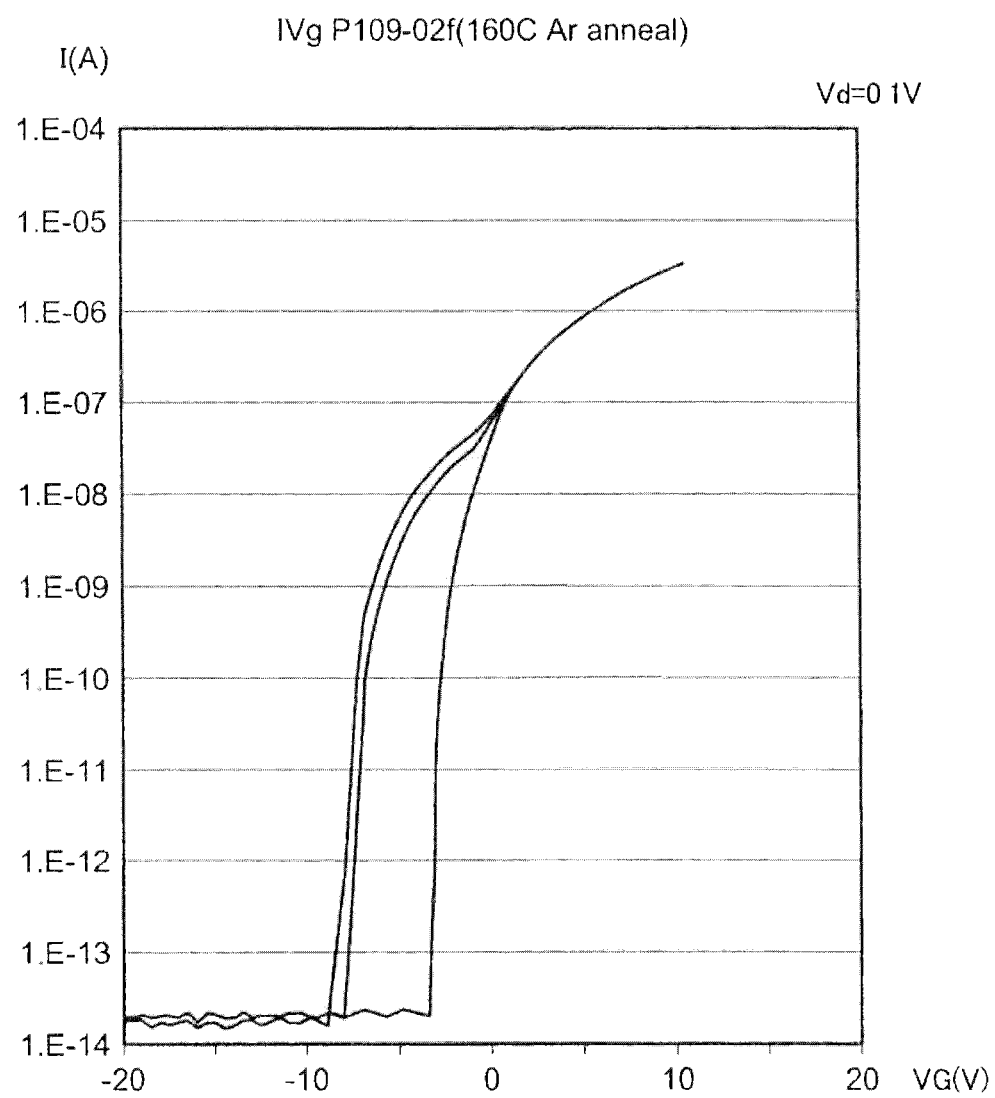
FIG. 5 is a diagram illustrating a characteristic when a leak current is generated in a thin film transistor.

The characteristics of the TFT 211 are shown in FIG. 5.

The horizontal axis shown in FIG. 5 expresses a gate voltage VG, and the vertical axis expresses a drain current I. Solid lines express the characteristics in the case where a leakage current is produced, and a broken line expresses the characteristics in the case where no leakage current is produced. The characteristics in two cases express the gate voltage VG up to a voltage of 10 V (volt). When a leakage current is produced, such a defective occurs that the threshold of the edges 240E of the semiconductor layer 240 is negatively shifted.

As described above, in the TFT 11 using an InGaZnO film for the semiconductor layer 140, the characteristics greatly fluctuate according to the conditions of forming $SiO_2$ (the first channel protective film 151) on the InGaZnO film.

Figures 6A, 6B:
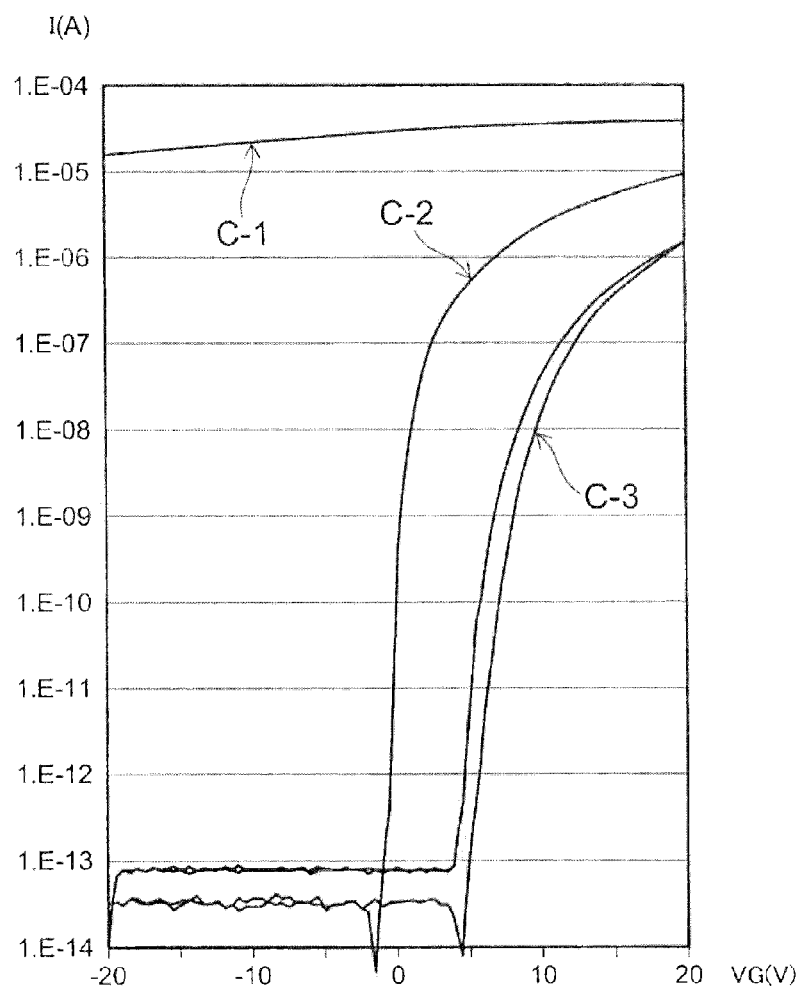
FIG. 6A is a diagram illustrating a film forming condition for the first channel protective film.
FIG. 6B is a diagram illustrating characteristics of the thin film transistors made by each film forming condition.

FIG. 6A shows the PE-CVD conditions of forming a $SiO_2$ first channel protective films 151 on an InGaZnO film. FIG. 6B shows the TFT characteristics using the first channel protective films 151 formed under the conditions.

As shown in FIG. 6A, three film forming conditions (conditions C-1 to C-3) were used. Marks indicated in curves in FIG. 6B correspond to marks (the conditions C-1 to C-3) indicated in FIG. 6A.

For a process of forming the TFT, a method in a first embodiment described in JP-A (Kokai) 2010-123748 was used. The first channel protective film 151 was formed by PE-CVD using a $SiH_4$ gas and a $N_2O$ gas. Here, the optimum conditions are the condition C-2 in FIG. 6A. The thresholds of the TFT characteristics are positively shifted if the $SiH_4$ ratio is decreased more than the $SiH_4$ ratio of the condition C-2. It was revealed that the threshold voltage of the TFT characteristics are positively shifted as the substrate temperature is more decreased and power (RF power at power-on) is more increased under the same gas conditions.

Namely, the flow ratio of the source gas containing Si in the entire source gas is decreased, the film forming rate is decreased, or the film forming temperature is lowered, so that the thresholds of the TFT characteristics can be positively shifted. It is considered that the thresholds of the TFT characteristics are positively shifted as the oxidation state of Si in the film is higher, that is, the element ratio of O/Si is higher.

As described above, in the case of the TFT using the first channel protective film 151, it is possible to improve the TFT characteristics by optimizing the conditions of forming the first channel protective film 151.

In the following, an exemplary manufacturing method for the TFT according to this embodiment will be described.

FIG. 7A, FIG. 7B, FIG. 7C, and FIG. 7D are schematic cross sectional views illustrating the process steps of a manufacturing method for the TFT according to the first embodiment.

These cross sections correspond to the cross section on line VII-VII shown in FIG. 1.

First, for example, $SiO_2$ is formed in a film for the insulating layer 110 on the major surface of the substrate 100 made of PEN (polyethylene naphtahalate) by sputtering, for example. After that, an Al film and a Mo film to be the gate electrode 120 are formed in a thickness of 150 nm and a thickness of 30 nm, respectively, by sputtering for stacking.

Figure 7A:
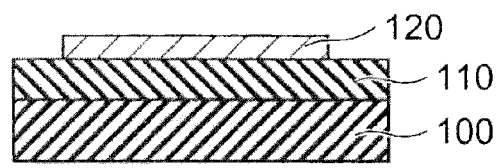
FIG. 7A to 7D are diagrams illustrating a manufacturing method for the thin film transistor according to the first embodiment.

Subsequently, as illustrated in FIG. 7A, the gate electrode 120 is processed in a predetermined pattern. Photolithography is used for this processing, and a mixed acid of phosphoric acid, acetic acid, and nitric acid is used for etching.

After that, a $SiO_2$ film to be the gate insulating layer 130 is formed in a thickness of 300 nm, for example, by PE-CVD using TEOS (Tetra Ethyl Ortho Silicate), for example. The film forming temperature in this film formation is set at a temperature of 160° C. in consideration of the heat-resisting properties of PEN. A $SiO_2$ film having a thickness of 50 nm was formed on the $SiO_2$ film by sputtering.

It is noted that the topmost layer of the gate insulating layer 130 affects the film characteristics of the semiconductor layer 140 formed on the top face of the topmost layer. In this embodiment, desirably, the topmost layer of the gate insulating layer 130 is a smooth film as much as possible with a small hydrogen content.

On the $SiO_2$ film, an InGaZnO film (an $In_2O_3$—$Ga_2O_3$—ZnO film, for example) to be the semiconductor layer 140 is formed in a thickness of 30 nm, for example, by reactive DC sputtering. In this film formation, the composition ratio of targets used is 1:1:1 at the atom number ratio of In:Ga:Zn. This film was formed in an atmosphere containing oxygen and argon, and the ratio of oxygen is about 1%, for example, to argon. The film forming temperature is a temperature of about a few tens° C., because heat treatment or the like is not particularly applied.

A $SiO_2$ film to be the first channel protective film 151 is formed in a thickness of 30 nm, for example, by PE-CVD using a $SiH_4$ gas and a $N_2O$ gas (source gases). Desirably, the semiconductor layer 140 and the first channel protective film 151 are formed in Vacuum In-Situ Processing without exposing the interface to atmosphere as much as possible. The first channel protective film 151 is used for a barrier film against water in processing the semiconductor layer 140 described later.

Desirably, the film thickness of the first channel protective film 151 is 10 nm or more in order to maintain sufficient barrier properties. In the case of using a film having a thickness of 10 nm or less, it is likely that water is penetrated in processing the semiconductor layer 140 due to a defect of the particle origin or the like and variations occur in the characteristics. If the thickness of the first channel protective film 151 is thick, etching damage might be produced in the semiconductor layer 140 and the gate insulating layer 130 below the semiconductor layer 140 in etching the first channel protective film 151.

For example, in the case of RIE using chlorine gas (Reactive Ion Etching) described later, if the first channel protective film 151 is thick, etching is performed too much to the gate insulating layer 130 in the lower layer, in consideration of the film thickness distribution of the first channel protective film 151 and the etching rate distribution of RIE. As decried later, also in etching the second channel protective film 152, is the gate insulating layer 130 is etched by the film thickness of the first channel protective film 151. In this embodiment, preferably, the thickness of the first channel protective film 151 is 50 nm or less.

Figure 7D:
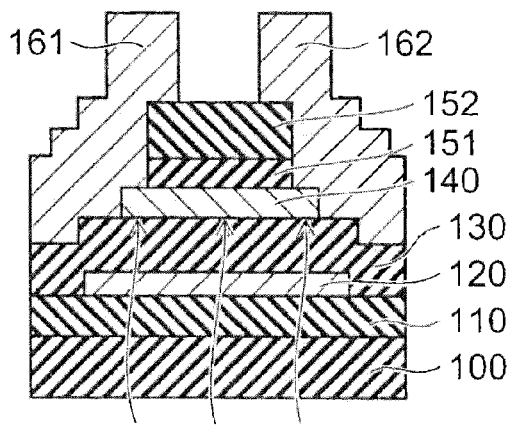
Figure 7B:
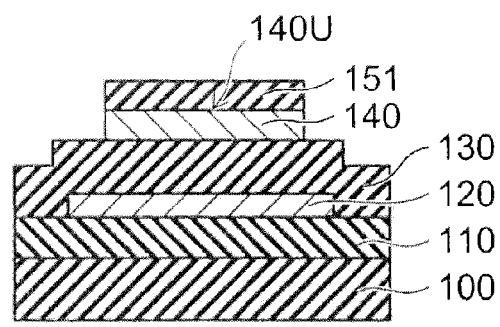

Subsequently, as shown in FIG. 7B, the first channel protective film 151 and the semiconductor layer 140 are continuously processed in a predetermined shape. RIE mainly using a chlorine gas, for example, is used for this etching. In consideration of the coverage of the second channel protective film 152 in the process steps described later, no side etch is to be produced in the semiconductor layer 140 (the InGaZnO film layer).

After this processing, a $SiO_2$ film to be the second channel protective film 152 is formed throughout the surface by PE-CVD using a $SiH_4$ gas and a $N_2O$ gas (source gases). For the film forming conditions in this film formation, such conditions are used that the gas ratio of $SiH_4/N_2O$ is decreased with respect to the aforementioned film forming conditions for the first channel protective film 151. The second channel protective film 152 is formed under these conditions, so that the resistance of the InGaZnO film is increased. It is important to use these conditions.

For example, the first channel protective film 151 is formed using a $SiH_4$ gas and a $N_2O$ gas in which the ratio of a $SiH_4$ gas flow rate to a $N_2O$ gas flow rate ($SiH_4$ flow rate/$N_2O$ flow rate) is used for a first value. The second channel protective film 152 is formed using a $SiH_4$ gas and a $N_2O$ gas in which the ratio of a $SiH_4$ gas flow rate to a $N_2O$ gas flow rate ($SiH_4$ flow rate/$N_2O$ flow rate) is used for a second value lower than a first value.

For example, the first channel protective film 151 is formed using a gas containing silicon and oxygen in which the ratio of a silicon quantity to an oxygen quantity (silicon quantity/oxygen quantity) is used for a first value. The second channel protective film 152 is formed using a gas containing silicon and oxygen in which the ratio of a silicon quantity to an oxygen quantity is used for a second value lower than the first value.

Figure 7C:
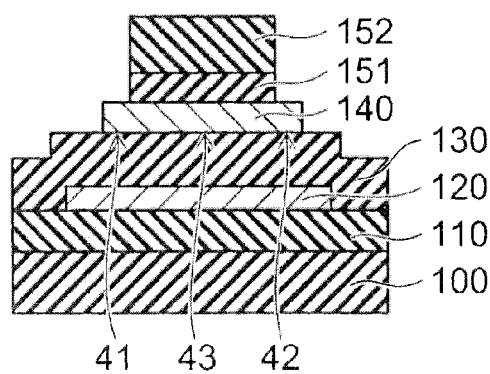

After that, as shown in FIG. 7C, the second channel protective film 152 and the first channel protective film 151 are processed in a predetermined shape. Thus, the semiconductor layer 140 having a portion contacted with the source electrode 161 and a portion contacted with the drain electrode 162 is exposed. For this processing, RIE was used in which a $CF_4$ gas is a main component. It is known that the InGaZnO film is hardly etched in typical RIE using a $CF_4$ gas.

After this processing, a Mo film (30 nm), an Al film (200 nm), and a Mo film (50 nm) to be the source electrode 161 and the drain electrode 162 are formed by sputtering.

As illustrated in FIG. 7D, these films are formed in a predetermined shape, and then the TFT 11 is completed.

Since the TFT 11 immediately after processed is damaged by ultraviolet rays or the like in processing, annealing (heat treatment) is performed in an annealing chamber at a temperature of about 150° C. for one hour.

For example, in this embodiment, annealing is performed in a nitrogen atmosphere in which oxygen is removed. Thus, it is possible to suppress deterioration such as coloring in the exposed portions around the plastic substrate or the like. The characteristics of the TFT 11 have no problem even though annealing is performed in a dry atmosphere. After this processing, although not shown in the drawing, a passivation film is appropriately formed on the top face.

In the oxide TFT, excellent characteristics can be obtained without performing heating such as annealing particularly. However, in consideration of long-term reliability, desirably, annealing is performed at a temperature of 150° C. or more, for example, as described above. In detailed study, it was confirmed that hydrogen moves (diffuses) in the InGaZnO film and the $SiO_2$ film therearound (i.e. the gate insulating layer 130, the first channel protective film 151, the second channel protective film 152, or the like). It was revealed that the move of hydrogen affects the characteristics of the InGaZnO-TFT. However, it was revealed that the InGaZnO film is processed in a predetermined shape and then a first annealing is performed, resulting in that the hydrogen concentration is distributed due to the processed shape or size of the InGaZnO film and the characteristics depends on the size of the TFT, for example, because the diffusivity of hydrogen are different in the InGaZnO film and $SiO_2$.

A PECVD-$SiO_2$ film, which is a film formed at low temperature, at a temperature of about 200° C. or less, using $SiH_4$ or TEOS for a source gas, contains about 0.1 at % of hydrogen in the film. On the other hand, the hydrogen content of the InGaZnO film formed by sputtering is much smaller than the hydrogen content of the PECVD-$SiO_2$ film. It is shown that when the InGaZnO film is processed and annealed, and then hydrogen is diffused in this state, the hydrogen concentration is different between the end and the center in the pattern of the InGaZnO film.

FIG. 18A to FIG. 18D are top views and cross sectional views showing an InGaZnO film before and after annealed.

Figure 18A:
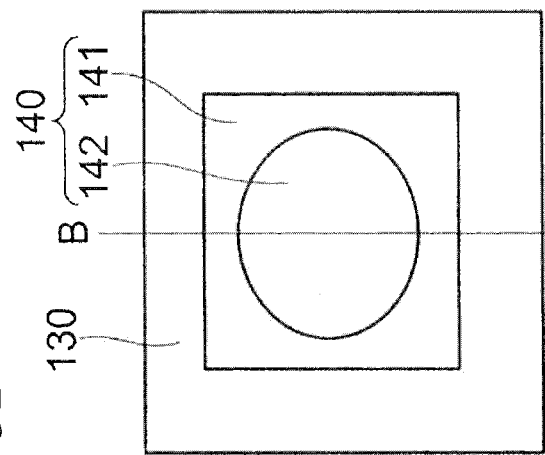
FIG. 18A to FIG. 18D are schematic views illustrating an InGaZnO film before and after annealed.
Figure 18B:
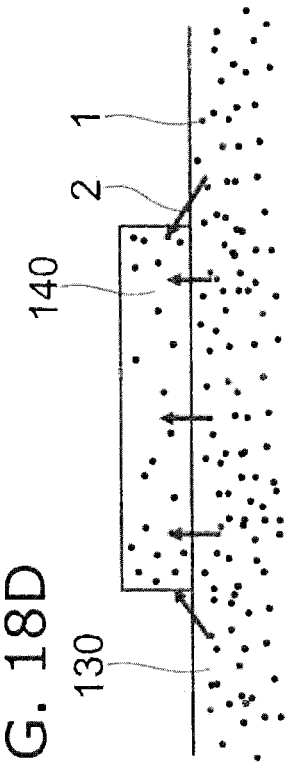
Figure 18C:
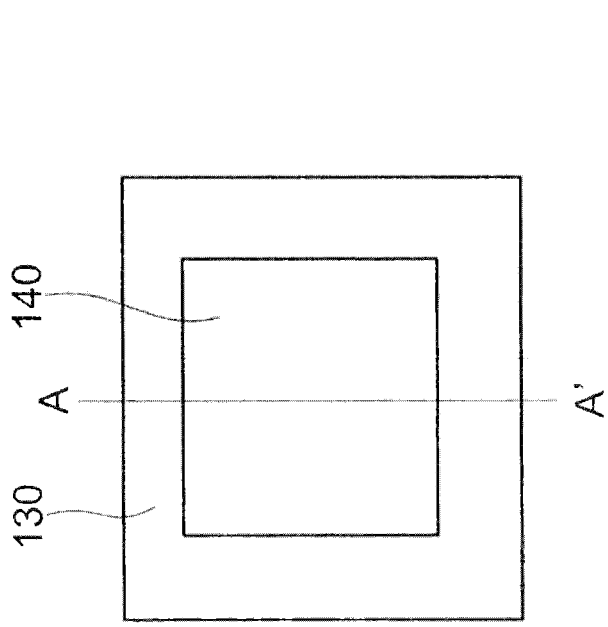
Figure 18D:
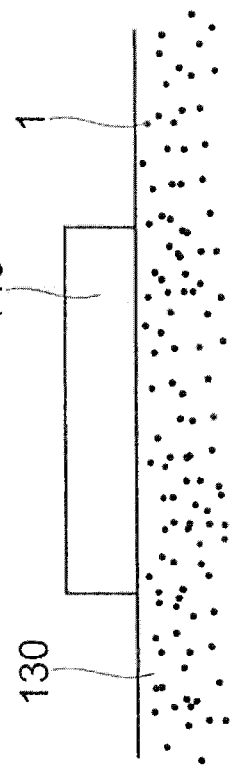

FIG. 18A is a top view showing a gate insulating layer 130 and an InGaZnO film (a semiconductor layer 140) before annealed. FIG. 18C is a cross sectional view on line A-A' in FIG. 18A. FIG. 18B is a top view showing the gate insulating layer 130 and the InGaZnO film (the semiconductor layer 140) after annealed. FIG. 18D is a cross sectional view on line B-B' in FIG. 18B.

As illustrated in FIG. 18D, hydrogen 1 in the gate insulating layer 130 is diffused into the InGaZnO film as indicated by arrows 2 after annealed. The hydrogen concentration at a pattern end 141 in the InGaZnO film is higher than the hydrogen concentration at a center 142 in the InGaZn film.

Desirably, annealing is performed before patterning the InGaZnO film, in order to solve the aforementioned problem.

An amorphous oxide material having In as a main component is used for the semiconductor layer 140, so that a TFT of excellent characteristics can be obtained even manufactured at low temperature. The TFT 11 according to this embodiment can also be manufactured at low temperature for increasing the area.

The state was observed in which the end portion of the InGaZnO film is covered with the second channel protective film.

Figure 16:
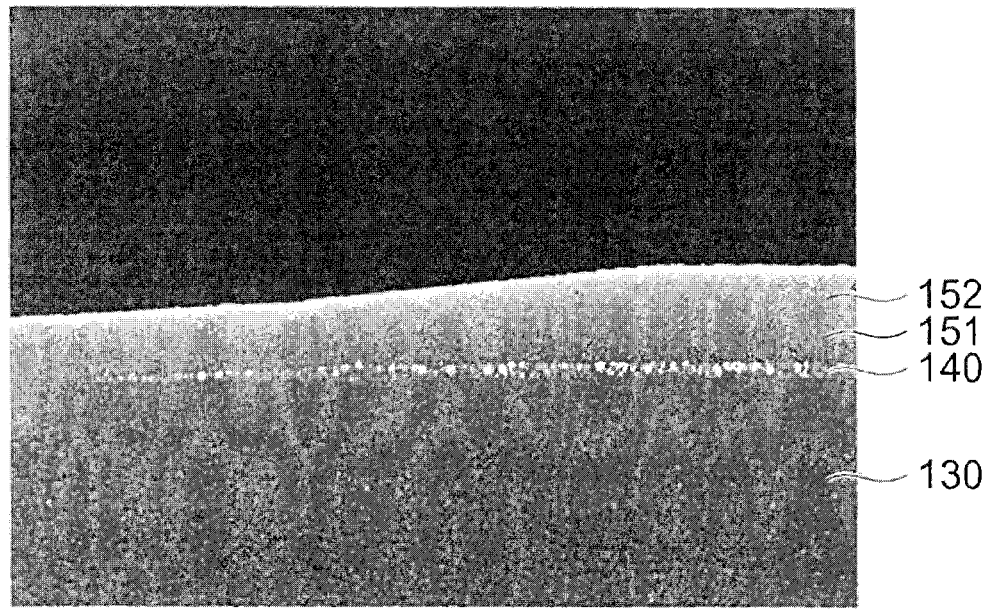
FIG. 16 is a diagram illustrating a cross section of a part of a TFT observed with of an SEM.

FIG. 16 is a diagram illustrating a cross section of a part of a TFT using an SEM (Scanning Electron Microscope).

Figure 17:
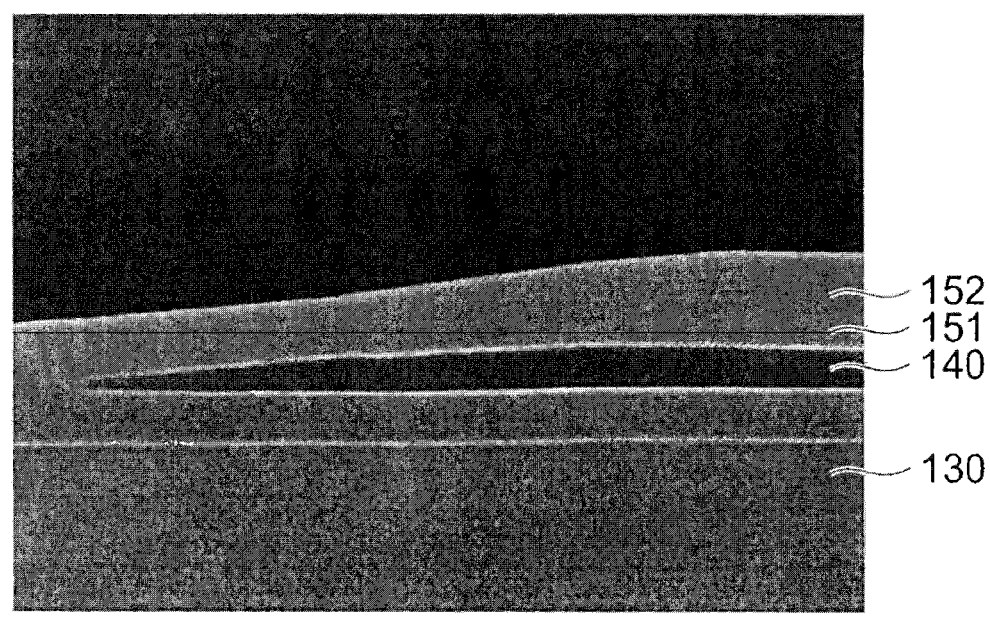
FIG. 17 is a diagram illustrating a cross section of a part of a TFT observed with an SEM after the TFT is processed using dilute hydrogen fluoride.

FIG. 17 is a diagram illustrating a cross section of a part of a TFT observed with an SEM after the TFT is processed using dilute hydrogen fluoride.

These SEM images were obtained with JSM-6000F made by JEOL Ltd. The microscope is not limited particularly as long as the microscope is a field-emission SEM. It is difficult to observe the interface between the first channel protective film 151 and the second channel protective film 152 by simply cutting the TFT (see FIG. 16). However, as illustrated in FIG. 17, dilute hydrogen fluoride (0.5%), for example, is applied to the cross section for 60 seconds, so that the interface between the first channel protective film 151 and the second channel protective film 152 can be observed.

It is shown that the first channel protective film 151 in the upper part is in etch-back at etching the InGaZnO film by RIE mainly using a chlorine gas, so that the end portion of the InGaZnO film is formed in a very gentle tapered shape.

HD-2300 made by Hitachi High-Technologies Corporation or the like is used to observe a TFT using a STEM (Scanning Transmission Electron Microscope) with no use of dilute hydrogen fluoride processing or the like, so that the interface between the first channel protective film 151 and the second channel protective film 152 can be observed.

Second Embodiment

Figure 8:
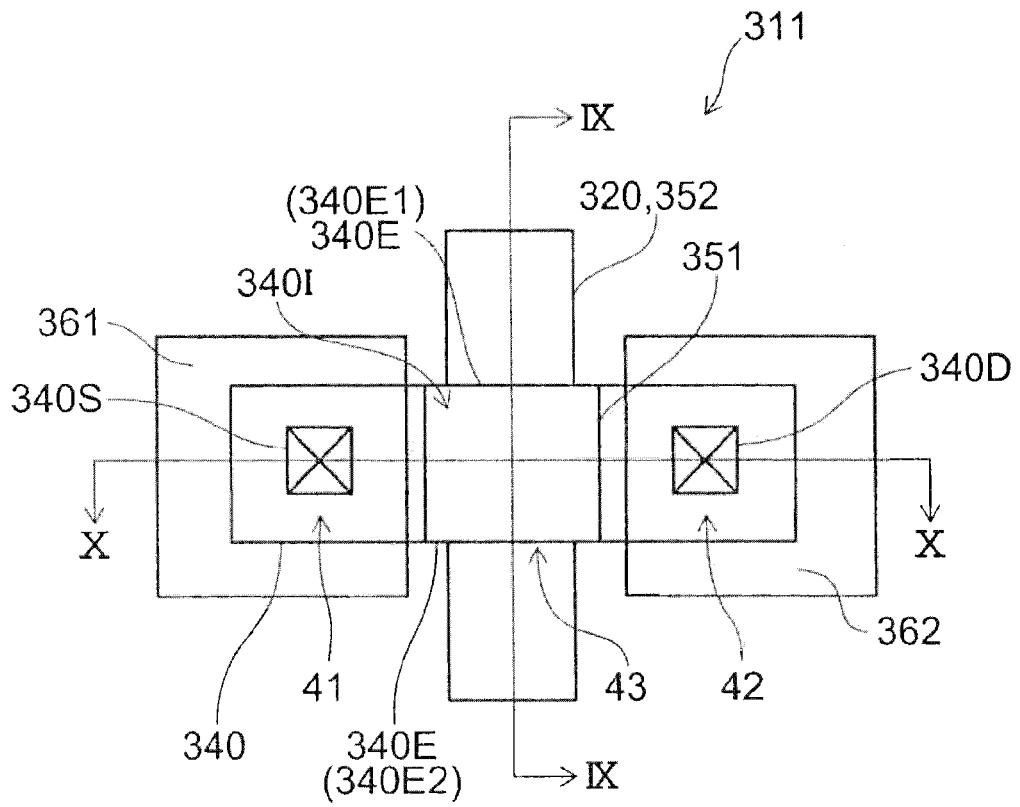
FIG. 8 is a schematic plane view illustrating a thin film transistor according to a second embodiment.
Figure 9:
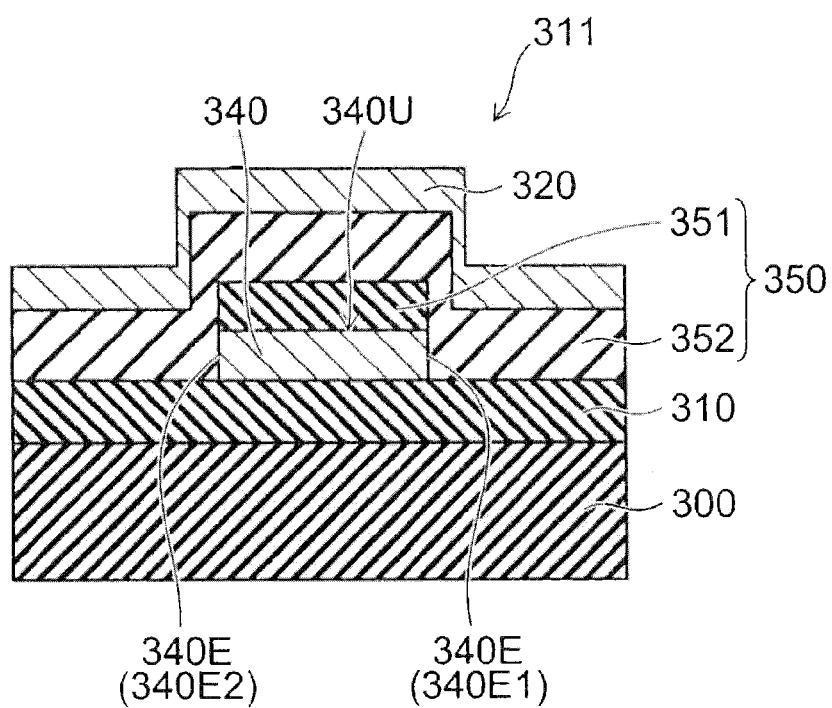
FIG. 9 is a diagram illustrating a cross section on line IX-IX shown in FIG. 8.

FIG. 8 is a schematic view illustrating the configuration of a top gate TFT according to a second embodiment. FIG. 9 is a cross sectional view on line IX-IX shown in FIG. 8.

As shown in FIG. 8 and FIG. 9, a TFT 311 includes a substrate 300, an insulating layer 310 provided on the substrate 300, a semiconductor layer 340 provided on the insulating layer 310 and containing oxide, and a gate insulating layer 350 provided on the semiconductor layer 340.

As illustrated FIG. 10D, described later, the TFT 311 further includes a gate electrode 320 provided on the gate insulating layer 350, an interlayer insulating film 370, a source electrode 361, and a drain electrode 362. The interlayer insulating film 370 covers the gate electrode 320 and a region except a source electrode contact region 340S and a drain electrode contact region 340D in the semiconductor layer 340. The source electrode 361 is provided on the source electrode contact region 340S in the semiconductor layer 340. The drain electrode 362 is provided on the drain electrode contact region 340D in the semiconductor layer 340.

As illustrated in FIG. 8 and FIG. 9, the gate insulating layer 350 includes a first gate insulating layer 351 (a first insulating film) and a second gate insulating layer 352 (a second insulating film). The first gate insulating layer 351 (the first insulating film) covers the semiconductor layer 140 except the source electrode contact region 340S and the drain electrode contact region 340D. The second gate insulating layer 352 (the second insulating film) covers the first gate insulating layer 351 and edges 340E (the side surfaces) of the semiconductor layer 340. The same material as the material of the first channel protective film 151 in the first embodiment can be used for the material of the first gate insulating layer 351. The same material as the material of the second channel protective film 152 in the first embodiment can be used for the material of the second gate insulating layer 352. The oxidation state of the second gate insulating layer 352 is higher than the oxidation state of the first gate insulating layer 351. As described above, the gate electrode 320 can be provided on at least one of the first insulating film (the first gate insulating layer 351) and the second insulating film (the second gate insulating layer 352).

Namely, the thin film transistor 311 includes the substrate 300, the semiconductor layer 340, the first insulating film, the second insulating film, the gate electrode 320, the first electrode (the source electrode 361), and the second electrode (the drain electrode 362). The semiconductor layer 340 is provided on the substrate 300. The semiconductor layer 340 contains an oxide including indium. The semiconductor layer 340 has a first portion 41, a second portion 42, and a middle portion 43. The semiconductor layer 340 has a top face 340U, a first side face 340E1 of the middle portion 43, and a second side face 340E2 of the middle portion 43. The top face 340U includes a first region (a source electrode contact region 340S) on the first portion 41, a second region (a drain electrode contact region 340D) on the second portion 42, and an other region 340I except the first region and the second region. The second side face 340E2 and the first side face 340E1 are arranged side by side along a second direction vertical to a first direction from the first portion 41 toward the second portion 42, the first direction being in parallel with the major surface of the substrate 300.

The first insulating film covers the other region 340I. The second insulating film covers at least the first side face 340E and the second side face 340E2. The second insulating film is formed under the conditions different from the conditions for the first insulating film. The gate electrode 320 faces the semiconductor layer 340. The first electrode is provided on the first region. The second electrode is provided on the second region.

Although the substrate 300 and the insulating layer 310 are omitted in FIG. 8, the substrate 300 and the insulating layer 310 are provided on the back side on the paper. The first gate insulating layer 351 is provided on the back of the gate electrode 320 on the paper. The region on which the second gate insulating layer 352 is provided is overlapped with the region on which the gate electrode 320 is provided.

In the following, an exemplary manufacturing method for the TFT 311 according to this embodiment will be described.

FIG. 10A to FIG. 10D are schematic cross sectional views illustrating the process steps of a manufacturing method for the TFT 311 according to the second embodiment. The cross sections in these drawings correspond to the cross section on line IX-IX in FIG. 8.

First, for example, $SiO_2$ is formed in a film for the insulating layer 310 on the major surface of the substrate 300 made of PEN (polyethylene naphtahalate) by sputtering, for example. After that, an InGaZnO film to be the semiconductor layer 340 is formed in a thickness of 30 nm by sputtering. The first gate insulating layer 351 is continuously formed in a thickness of 30 nm by reactive sputtering using $SiO_2$ for a target.

Figure 10A:
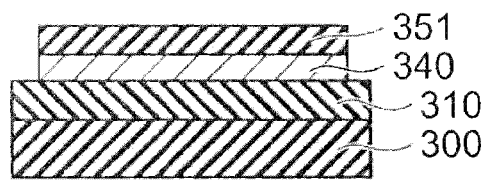
FIG. 10A to 10D are diagrams illustrating a manufacturing method for the thin film transistor according to the second embodiment.

As shown in FIG. 10A, the first gate insulating layer 351 and the semiconductor layer 340 are processed in a predetermined shape.

After that, a $SiO_2$ film to be the second gate insulating layer 352 is formed in a thickness of 100 nm on the edges 340E of the semiconductor layer 340 and the first gate insulating layer 351 by PE-CVD using a $SiH_4$ gas and a $N_2O$ gas (source gases). After that, a MoW alloy is formed in a film in a thickness of 100 nm for the gate electrode 320.

Figure 10B:
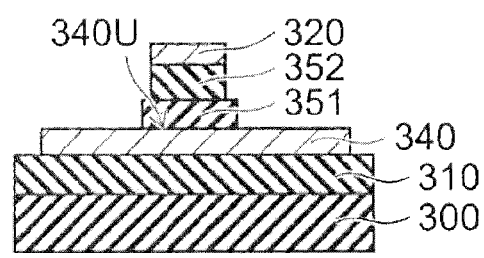

As shown in FIG. 10B, the gate electrode 320, the second gate insulating layer 352, and the first gate insulating layer 351 are formed in a predetermined shape, and the source electrode contact region 340S and the drain electrode contact region 340D of the semiconductor layer 340 are exposed.

$SiO_2$ to be the interlayer insulating film 370 is then formed by PE-CVD using a $SiH_4$ gas and a $N_2O$ gas (source gases). In this film formation, $SiO_2$ is formed in a film under the film forming conditions with a high $SiH_4$ ratio in such a way that the resistance of the semiconductor layer 340 contacted with the interlayer insulating film 370 is decreased. Alternatively, the resistance of the semiconductor layer 340 can be decreased also using TEOS and an $O_2$ gas, instead of $SiH_4$ and $N_2O$.

Figure 10C:
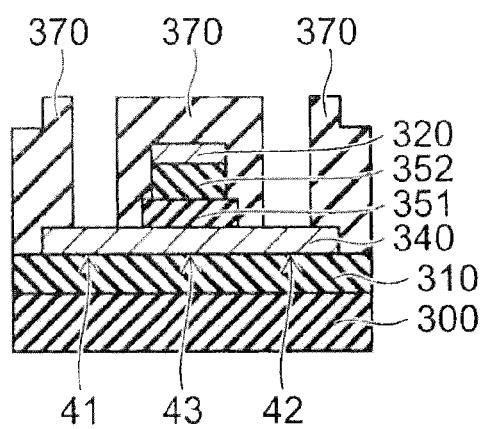

As shown in FIG. 10C, openings connecting to the source electrode contact region 340S and the drain electrode contact region 340D of the semiconductor layer 340 are formed in the interlayer insulating film 370. After that, a Mo film (50 nm), an Al film (200 nm), and a Mo film (50 nm) to be the source electrode 361 and the drain electrode 362 are stacked in the openings in this order.

Figure 10D:
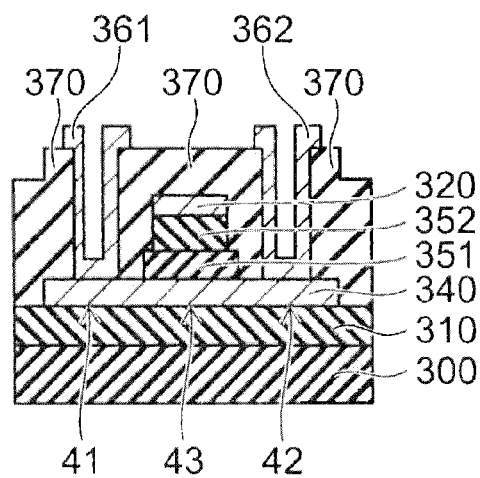

As shown in FIG. 10D, these films are processed in a predetermined shape, and then the TFT 311 is completed.

Also in the TFT 311 according to this embodiment, it is possible that the second insulating film (the second gate insulating layer 352) covering the edges 340E of the semiconductor layer 340 is formed to have an oxidation state higher than the oxidation state of the first insulating film (the first gate insulating layer 351) covering the top face of the semiconductor layer 340. Thus, it is possible to obtain the similar effect as that of the first embodiment.

Third Embodiment

Figure 11:
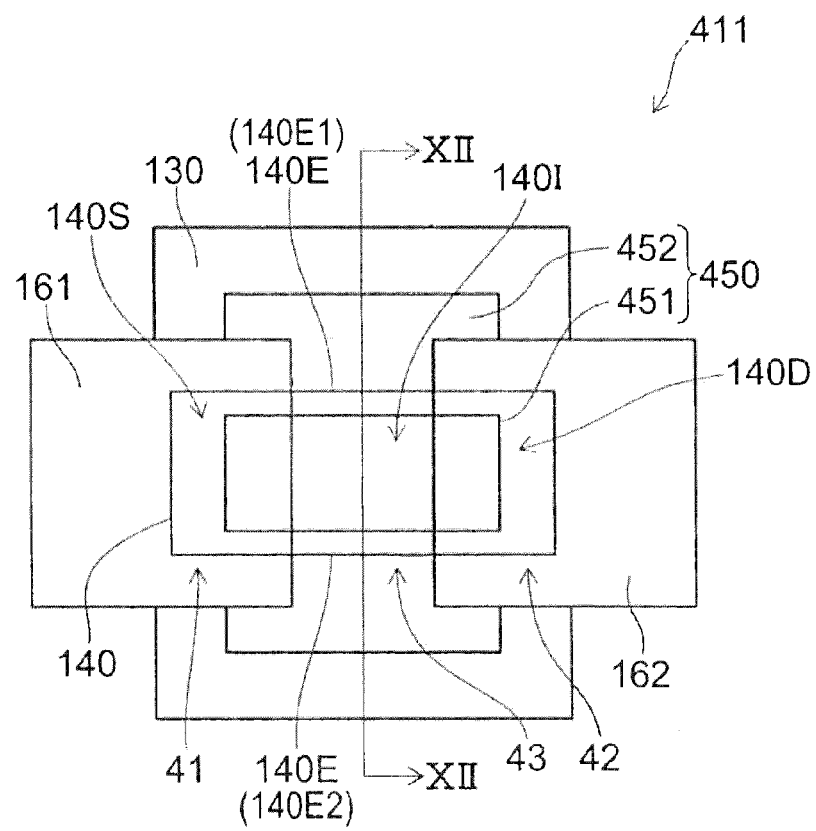
FIG. 11 is a schematic plane view illustrating a thin film transistor according to a third embodiment.
Figure 12:
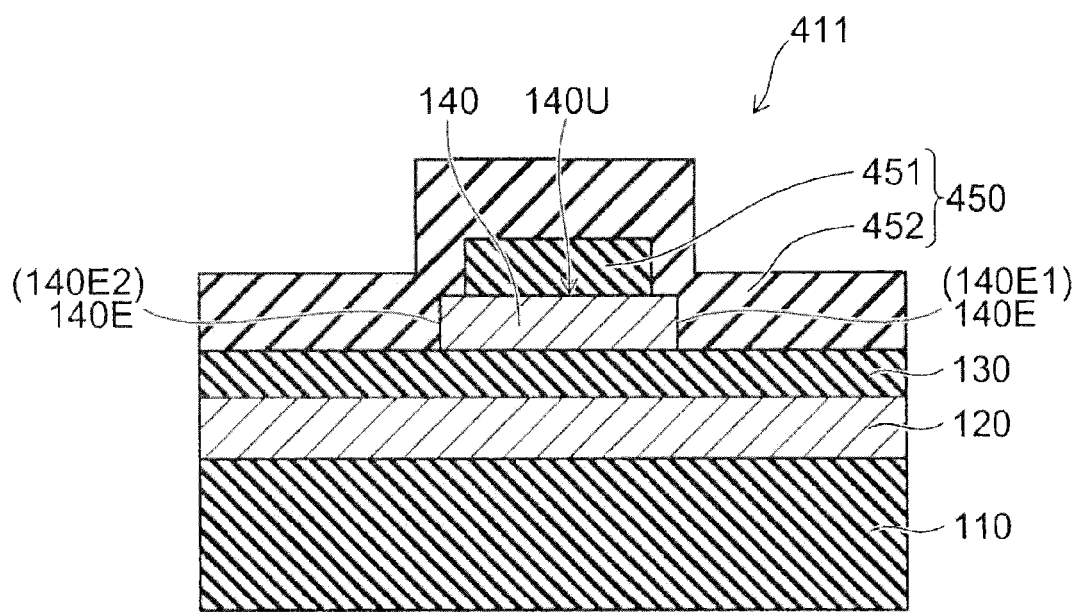
FIG. 12 is a diagram illustrating a cross section on line XII-XII shown in FIG. 11.

FIG. 11 is a schematic view illustrating the configuration of a bottom gate TFT according to a third embodiment. FIG. 12 is a cross sectional view on line XII-XII shown in FIG. 11.

This embodiment is another embodiment of the TFT according to the first embodiment.

In a TFT 411 according to this embodiment, the width between two edges 140E of a semiconductor layer 140 (the width along a second direction vertical to a first direction from a source electrode contact region 140S toward a drain electrode contact region 140D, the first direction being in parallel with the major surface of an insulating layer 110, for example) is wider than the width of a first channel protective film 451 in the same direction (the width along the second direction). The other configurations are the same as the configurations of the TFT according to the first embodiment. A channel protective film 450 includes the first channel protective film 451 and a second channel protective film 452. The first channel protective film 451 covers the top face of the semiconductor layer 140 except a source region (a source electrode contact region 140S) in which the semiconductor layer 140 is contacted with a source electrode 161 and a drain region (a drain electrode contact region 140D) in which the semiconductor layer 140 is contacted with a drain electrode 162. The second channel protective film 452 covers the first channel protective film 451 and the edges 140E of the semiconductor layer 140.

This TFT 411 can be manufactured as below. The semiconductor layer 140 and the first channel protective film 451 are formed on the gate insulating layer 130, $SiO_2$ that is the first channel protective film 451 is then etched into a predetermined shape by RIE mainly using $CF_4$. After that, an InGaZnO film to be the semiconductor layer 140 is processed in a shape larger than the shape of the first channel protective film 151. In this case, for the etchant for the InGaZnO film, dilute hydrochloric acid, oxalic acid, or the like can be used.

In the case where the width between the edges 140 of the semiconductor layer 140 is made equal to the width of the first channel protective film 451 and continuously processed in a predetermined shape, side etch is sometimes produced in the semiconductor layer 140 with respect to the first channel protective film 451. Although chlorine gas can also be used for processing the InGaZnO film, chlorine gas is highly poisonous and difficult to treat.

However, it is possible to readily manufacture the TFT 411 according to this embodiment because side etch does not tend to be produced and no chlorine gas is used.

Also in the TFT 411 according to this embodiment, it is possible that the second insulating film (the second channel protective film 452) covering the edges 140E of the semiconductor layer 140 is formed to have an oxidation state higher than the oxidation state of the first insulating film (the first channel protective film 451) covering the top face of the semiconductor layer 140. Thus, it is possible to obtain the similar effect as that of the first embodiment.

Fourth Embodiment

Figure 13:
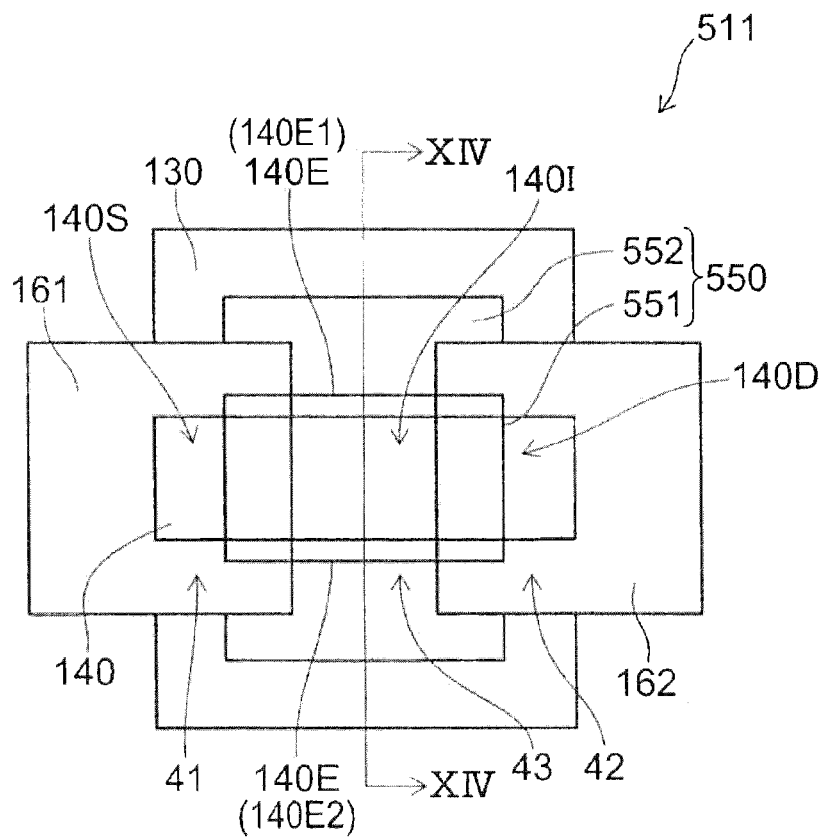
FIG. 13 is a schematic plane view illustrating a thin film transistor according to a fourth embodiment.
Figure 14:
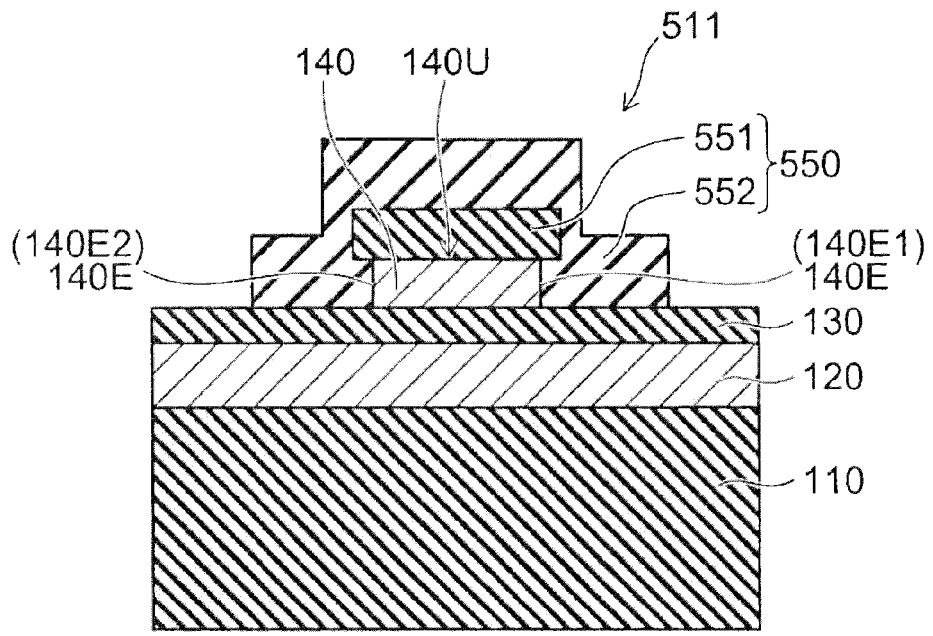
FIG. 14 is a diagram illustrating a cross section on line XIV-XIV shown in FIG. 13.

FIG. 13 is a schematic view illustrating the configuration of a bottom gate TFT according to a fourth embodiment. FIG. 14 is a cross sectional view on line XIV-XIV shown in FIG. 14.

This embodiment is another embodiment of the TFT according to the first embodiment.

In a TFT 511 according to this embodiment, the width between edges 140E of a semiconductor layer 140 (the width along a second direction) is shorter than the width of a first channel protective film 551 in the same direction (the width along the second direction). The other configurations are the same as the configurations of the TFT according to the first embodiment. A channel protective film 550 includes the first channel protective film 551 and a second channel protective film 552. The first channel protective film 551 covers the top face of the semiconductor layer 140 except a source region (a source electrode contact region 140S) in which the semiconductor layer 140 is contacted with a source electrode 161 and a drain region (a drain electrode contact region 140D) in which the semiconductor layer 140 is contacted with a drain electrode 162. The second channel protective film 552 covers a first channel protective film 451 and the edges 140E of the semiconductor layer 140.

This TFT 511 can also obtain the similar effect as that of the first embodiment.

For the second channel protective film 552, a coating insulating layer can be used. A coating insulating layer is used, so that the InGaZnO film can be processed with no use of RIE or the like using a chlorine gas, which is an expensive process.

A coating film is used for the second channel protective film 552, so that the coating film flows into the edges 140E to cover the edges 140E even though a side etch of about 1 μm is produced at the edges 140E of the semiconductor layer 140.

For the material of the second channel protective film 552, it was revealed that such a resin is suitable that the resin contains C (carbon), H (hydrogen), O (oxygen), N (nitrogen), and the like as main components and further contains F (fluorine). It is considered that a resin, in which a part of the terminal end part of the molecule is substituted from hydrogen to fluorine, is used, so that the resistance of the InGaZnO film contacted with the second channel protective film 552 is changed. It was revealed from experiments that the sheet resistance of the InGaZnO film is higher in about one digit in the case where the InGaZnO film is provided on a resin containing F than in the case where the InGaZnO film is provided on a typical acrylic resin, in the annealing range up to a temperature of 200° C. It is noted that this effect was obtained at 5 wt % or more of a fluorine load to a resin.

Fifth Embodiment

The TFTs according to the aforementioned embodiments have highly uniform characteristics and high reliability. An active matrix LCD (a display device) can be formed using these TFTs.

Figures 15A, 15B:
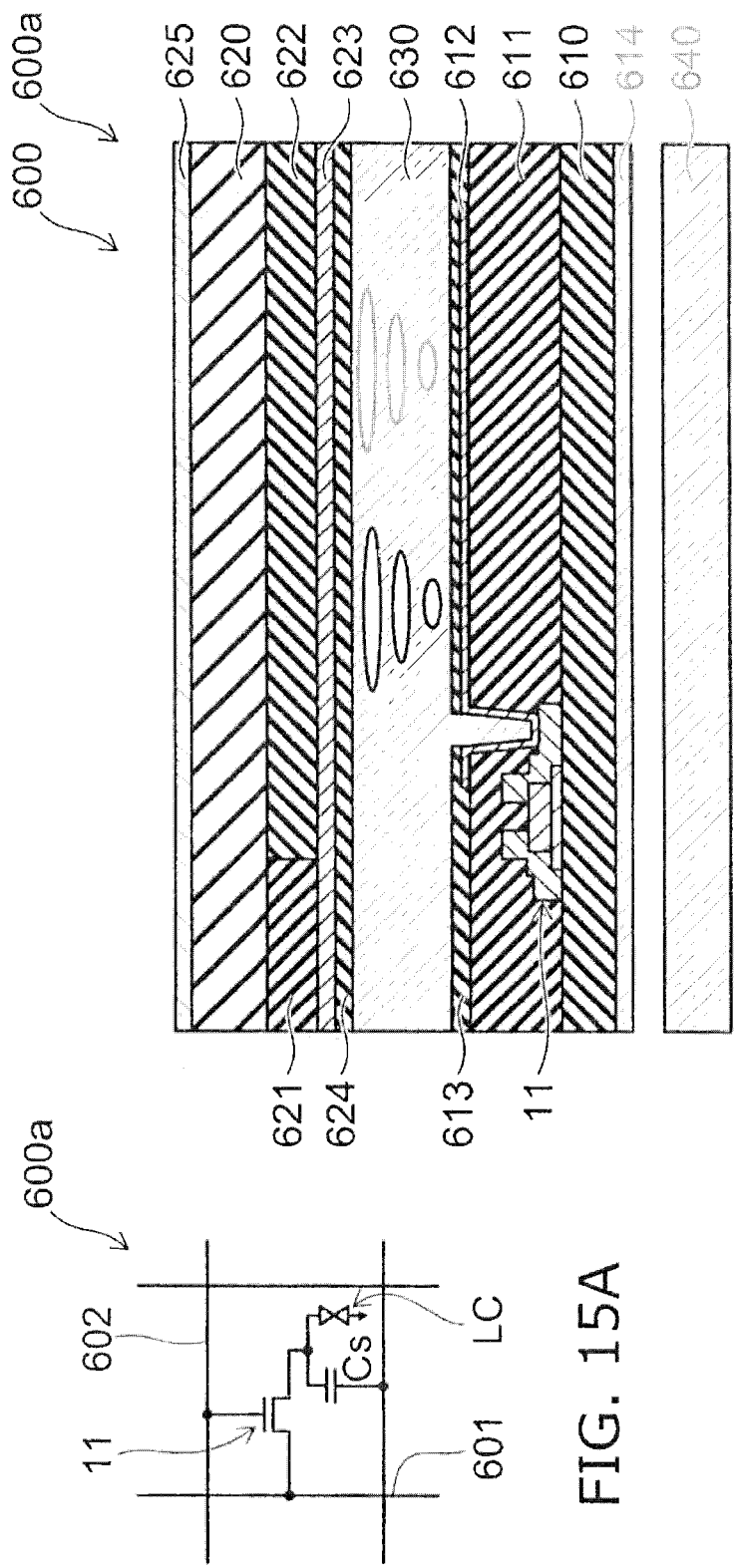
FIG. 15A is a diagram illustrating a picture circuit using a thin film transistor.
FIG. 15B is a diagram illustrating a cross section of a display device.

FIG. 15A shows the equivalent circuit of a pixel circuit. FIG. 15B shows the cross sectional structure of an active matrix LCD (display device 600a). Here, the case will be described where the TFT 11 according to the first embodiment is used. The TFTs according to the other embodiments can also be used.

The display device 600a has a plurality of signal lines 601, and a plurality of gate lines 602 extending in a direction vertical to a direction in which the plurality of signal lines 601 extend. A single pixel circuit is surrounded by a single signal line 601 and a single gate line 602. The pixel circuit has a capacitor CS and a liquid crystal layer LC (display layer), for example, in addition to the TFT 11.

The active matrix LCD includes a liquid crystal cell 600 and a backlight 640. The liquid crystal cell 600 includes an array substrate 610, a counter substrate 620, and a liquid crystal layer 630 (liquid crystal layer LC), for example. The array substrate 610 includes the TFT 11, a passivation film 611, and a pixel electrode 612, which are provided on one major surface of the array substrate 610. The counter substrate 620 includes color filter layers 621 and 622 and a counter electrode 623, which are provided on one major surface of the counter substrate 620. The liquid crystal layer 630 is provided between the array substrate 610 and the counter substrate 620. An alignment film 613 is provided on the pixel electrode 612 of the array substrate 610. An alignment film 624 is provided on the counter electrode 623 of the counter substrate 620. A polarizer 614 and a polarizer 625 are further provided, and the array substrate 610 and the counter substrate 620 are provided therebetween.

Although the TFT using an InGaZnO film has a significantly high reliability, it is known that the application of an ultraviolet ray having energy greater than the band gap energy worsens the characteristics. The wavelength to worsen the characteristics is a wavelength of 400 nm or less, and there are few worries about deterioration in the case of using a typical backlight such as an LED, which does not emit rays having a wavelength of 400 nm or more.

However, it is known that a negative voltage is applied to the gate electrode while applying rays to the TFT, causing a phenomenon that the TFT is worsened. This phenomenon also arises due to the application of rays having a wavelength of about 400 nm, and it is difficult to take full measures under the present techniques. Therefore, it is important that rays from the backlight are not allowed to enter the channel region of the TFT.

The refractive index of the InGaZnO film is about 1.8 to 2, and the refractive index is larger than the refractive index, 1.4 to 1.5, of $SiO_2$ or the like that is a surrounding transparent film. Thus, it is considered that when rays enter the InGaZnO film, the rays propagate the inside of the InGaZnO film according to the waveguide mode. Consequently, the pattern of the InGaZnO film is included in the gate electrode when seen in plane so as to shield the InGaZnO film with the gate electrode against the rays, so that it is possible to improve reliability.

In the case where the TFT is formed on a resin such as PEN (polyethylene naphtahalate), the gate electrode in the lower layer has the barrier effect against moisture in the resin layer or against hydrogen from the barrier film from water under the gate electrode. Therefore, the InGaZnO layer sensitive to moisture or hydrogen is provided in such a way that the InGaZnO layer is substantially included in the inside of the gate electrode when seen in plane, so that it is possible that the InGaZnO layer is made insensitive to moisture or hydrogen from the layer below the gate electrode.

Accordingly, the pattern of the InGaZnO film is included in the inside of the gate electrode when seen in plane, so that it is possible to further improve reliability.

The display device 600a according to this embodiment includes the thin film transistor according to any one of the aforementioned embodiments and a display layer (for example, the liquid crystal layer 630). At least one of optical emission and a change in the optical properties including at least one of birefringence, optical activity, scattering property, diffraction property, and optical absorption occurs in the display layer, according to at least one of a voltage and a current supplied through this thin film transistor.

In the description above, although the LCD is explained for an example of the display device, it is also possible to apply the TFTs according to the embodiments to other display devices such as an organic electroluminescent display device, for example.

Sixth Embodiment

An exemplary manufacturing method for a TFT according to a sixth embodiment will be described.

Figure 19:
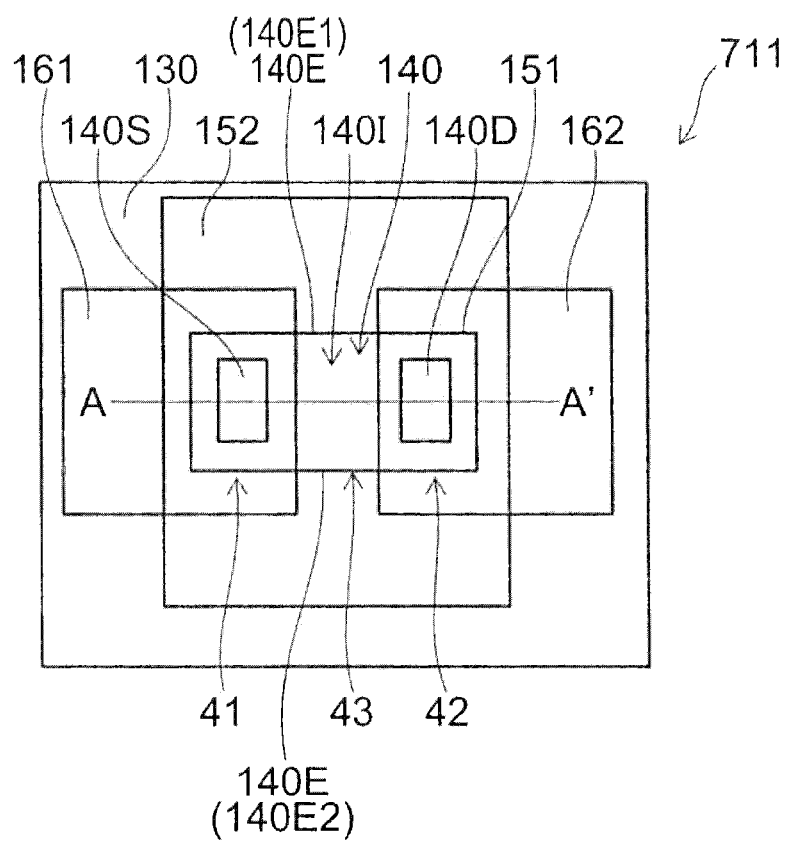
FIG. 19 is a schematic plane view illustrating a thin film transistor according to a sixth embodiment.

FIG. 19 is a schematic plane view illustrating the configuration of a bottom gate TFT (TFT 711) according to the sixth embodiment.

FIG. 20A to FIG. 20D are cross sectional views illustrating a manufacturing method for the TFT 711 according to the sixth embodiment.

FIG. 20A to FIG. 20D correspond to the cross section on line A-A' shown in FIG. 19.

First, SiN and $SiO_2$ are formed in a film for an insulating layer 110 on the major surface of a PEN substrate 100, for example, by PE-CVD, for example. After that, an Al film and a Mo film to be a gate electrode 120 are formed in a thickness of 150 nm and a thickness of 30 nm, respectively, by sputtering for stacking.

Figure 20A:
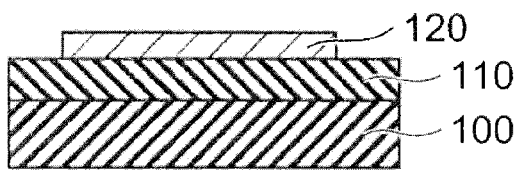
FIG. 20A to 20D are diagrams illustrating a manufacturing method for the thin film transistor according to the sixth embodiment.

Subsequently, as illustrated in FIG. 20A, the gate electrode 120 is processed in a predetermined pattern. Photolithography is used for this processing, and a mixed acid of phosphoric acid, acetic acid, and nitric acid is used for etching.

After that, a $SiO_2$ film to be a gate insulating layer 130 is formed in a thickness of 200 nm, for example, by plasma CVD using $SiH_4$ and $N_2O$, for example. The film forming temperature in this film formation is a temperature of 160° C. in consideration of the heat-resisting properties of PEN of the substrate 100.

On this $SiO_2$ film, an InGaZnO film (an $IN_2O_3$—$Ga_2O_3$—ZnO film, for example) to be a semiconductor layer 140 is formed in a thickness of 30 nm, for example, by reactive DC sputtering. In this film formation, the composition ratio of targets used is 1:1:1 at the atom number ratio of In:Ga:Zn. This film is formed in an atmosphere containing oxygen and argon, and the ratio of oxygen is about 1%, for example, to argon. The film forming temperature is a temperature of about a few tens° C., because heat treatment or the like is not particularly applied.

A $SiO_2$ film to be a first channel protective film 151 is formed in a thickness of 30 nm, for example, by PE-CVD using a $SiH_4$ gas and a $N_2O$ gas (source gases). Desirably, the semiconductor layer 140 and the first channel protective film 151 are formed in Vacuum In-situ Processing without exposing the interface to atmosphere, as much as possible. The first channel protective film 151 is used for a barrier film against water in processing the semiconductor layer 140 described later.

Figure 20B:
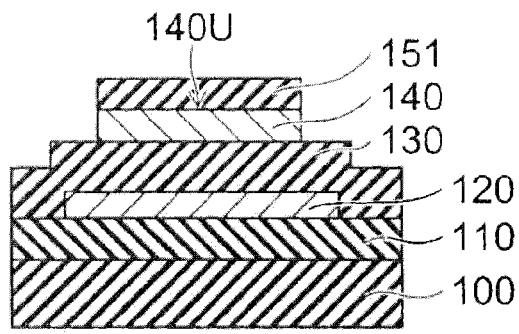

Subsequently, as shown in FIG. 20B, the first channel protective film 151 and the semiconductor layer 140 are continuously processed in a predetermined shape. For example, the first channel protective film 151 and the semiconductor layer 140 are processed by RIE mainly using a chlorine gas. In consideration of the coverage of the second channel protective film 152 in the process steps described later, no side etch is to be produced in the semiconductor layer 140 (the InGaZnO film).

After this processing, a $SiO_2$ film is formed for a second channel protective film 152 throughout the surface by PE-CVD using a $SiH_4$ gas and a $N_2O$ gas (source gases). For the film forming conditions in this film formation, such conditions are used that the gas ratio of $SiH_4/N_2O$ is decreased with respect to the aforementioned film forming conditions for the first channel protective film 151. Namely, the second channel protective film 152 is formed under the conditions that the resistance of the InGaZnO film is increased. The conditions are important.

Figure 20C:
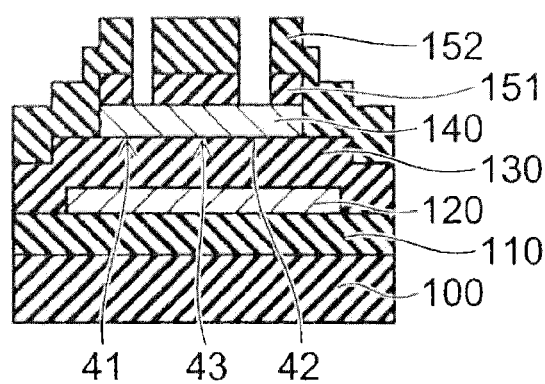

After that, as shown in FIG. 20C, the second channel protective film 152 and the first channel protective film 151 are processed in a predetermined shape in such a way that the contact region of the semiconductor layer 140 is exposed. This processing is performed by RIE using a $CF_4$ gas or a $CHF_3$ gas or $CF_4$ and $CHF_3$ mixed gas for a main component. Since the InGaZnO film is hardly processed in typical RIE using a $CF_4$ gas or a $CHF_3$ gas or $CF_4$ and $CHF_3$ mixed gas, the contact hole to gate electrode 120 can be formed (etching the second channel protective film 152 and the first channel protective film 151 and gate insulating layer 130) at etching the second channel protective film 152 and the first channel protective film 151 simultaneously.

After this processing, a Mo film (a thickness of 30 nm), an Al film (a thickness of 200 nm), and a Mo film (a thickness of 50 nm) to be a source electrode 161 and a drain electrode 162 are formed by sputtering.

Figure 20D:
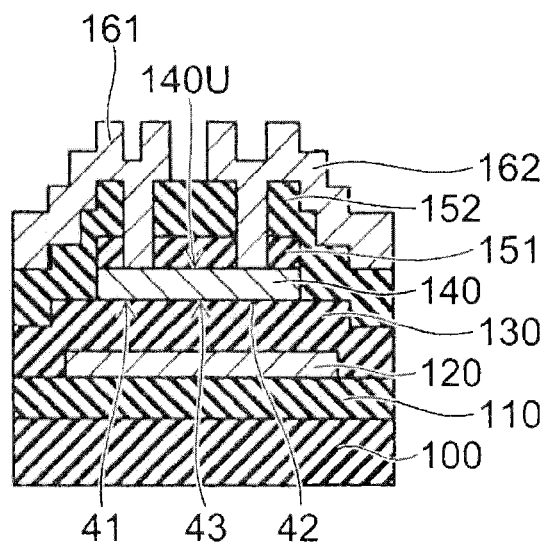

As illustrated in FIG. 20D, these films are formed in a predetermined shape, and then the TFT 711 is completed. Since the TFT 711 immediately after processed is damaged by ultraviolet rays or the like in processing, annealing (heat treatment) is performed in an annealing chamber at a temperature of about 150° C. for one hour.

A manufacturing method for a thin film transistor according to an embodiment includes: forming a first insulating film under first forming conditions; and forming a second insulating film under conditions different from the first forming conditions.

According to the embodiment, it is possible to provide a highly reliable thin film transistor using an oxide semiconductor, a manufacturing method for the same, and a display device.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, the specific configurations of components constituting a thin film transistor, a manufacturing method for the same, a display device, and a manufacturing method for the same can be included in the scope of the invention, as long as a person skilled in the art may appropriately select configurations from the publicly known ranges to similarly implement the invention and to obtain the similar effect.

Further, any two or more components of the specific examples may be combined within the extent of technical feasibility and are included in the scope of the embodiments to the extent that the spirit of the embodiments is included.

Moreover, all thin film transistors, manufacturing methods for the same, and display devices, which can be implemented by a person skilled in the art to appropriately change the design based on the thin film transistors, the manufacturing methods for the same, and the display device described above, which are described for the embodiments of the invention, are within the scope of the invention to the extent that the purport of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method for a thin film transistor, comprising:
   forming a structure on a substrate, the structure including:
      a semiconductor layer provided on the substrate, the semiconductor layer being made of an oxide including indium, the semiconductor layer having a top face, a first side face and a second side face, the first side face and the second side face being non-parallel to the top face, the second side face being apart from the first side face in a first direction, the top face having a first region, a second region, and an other region; a gate electrode provided between the semiconductor layer and the substrate; a gate insulating film provided between the gate electrode and the semiconductor layer; a first insulating film covering the other region of the semiconductor layer; and a second insulating film covering and physically contacting at least a part of the first side face and at least a part of the second side face, the forming the structure including forming the first insulating film under a first condition of film forming with a first source gas including a first gas containing silicon and a second gas containing oxygen and including forming the second insulating film under a second condition of film forming with a second source gas including the first gas containing silicon and the second gas;
   forming a source electrode on the first region of the semiconductor layer; and
   forming a drain electrode on the second region of the semiconductor layer, the drain electrode being apart from the source electrode in a second direction perpendicular to the first direction and parallel to the top face, the part of the first side face and the part of the second side face of the semiconductor layer being disposed between the source electrode and the drain electrode,
   wherein the second condition includes at least one of:
      a second ratio of a second silicon quantity in second source gas to a second oxygen quantity in the second source gas being lower than a first ratio of a first silicon quantity in the first source gas to a first oxygen quantity in the first source gas;
      a second flow rate of the second source gas in the forming the second insulating film being lower than a first flow rate of the first source gas in the forming the first insulating film; and
      a second film forming temperature in the forming the second insulating film being lower than a first film forming temperature in the forming the first insulating film,
   the first insulating film has a part provided between the semiconductor layer and the source electrode and a part provided between the semiconductor layer and the drain electrode, and
   the second insulating film has a part provided between the semiconductor layer and the source electrode and a part provided between the semiconductor layer and the drain electrode.

2. The method according to claim 1, wherein,
   annealing at a highest temperature in forming process of the thin film transistor for 10 minutes or more is performed after the forming the first insulating film; or
   annealing at the highest temperature in forming process of the thin film transistor for 10 minutes or more is performed in the forming the first insulating film.

3. The method according to claim 1, wherein the forming the structure includes:
   forming a film of the oxide including indium on the substrate, the film being served as the semiconductor layer,
   annealing the film, and
   processing the annealed film to form the semiconductor layer.

4. The method according to claim 1, wherein the first insulating film has a third side face and a fourth side face, the first side face and the second side face being formed in tapered shape and the third side face and the fourth side face being formed in tapered shape.

5. The method according to claim 1, wherein the second insulating film is formed by a coating.

6. The method according to claim 1, wherein the first region and the second region are disposed inside the first insulating film and inside the second insulating film when projected to a plane parallel to the substrate.

7. A manufacturing method for a display device, comprising:
   forming a structure on a substrate, the structure including:
      a semiconductor layer provided on the substrate, the semiconductor layer being made of an oxide including indium, the semiconductor layer having a top face, a first side face and a second side face, the first side face and the second side face being non-parallel to the top face, the second side face being apart from the first side face in a first direction, the top face having a first region, a second region, and an other region; a gate electrode provided between the semiconductor layer and the substrate; a gate insulating film provided between the gate electrode and the semiconductor layer; a first insulating film covering the other region of the semiconductor layer; and a second insulating film covering and physically contacting at least a part of the first side face and at least a part of the second side face, the forming the structure including forming the first insulating film under a first condition of film forming with a first source gas including a first gas containing silicon and a second gas containing oxygen and including forming the second insulating film under a second condition of film forming;

forming a source electrode on the first region of the semiconductor layer;

forming a drain electrode on the second region of the semiconductor layer, the drain electrode being apart from the source electrode in a second direction perpendicular to the first direction and parallel to the top face, the part of the first side face and the part of the second side face of the semiconductor layer being disposed between the source electrode and the drain electrode; and forming a display layer configured to cause at least one of optical emission and a change in an optical property including at least one of birefringence, optical activity, scattering property, diffraction property, and optical absorption, according to at least one of a voltage and a current supplied through the thin film transistor, wherein the second condition of film forming includes at least one of:
 a second ratio of a second silicon quantity in second source gas to a second oxygen quantity in the second source gas being lower than a first ratio of a first silicon quantity in the first source gas to a first oxygen quantity in the first source gas;
 a second flow rate of the second source gas in the forming the second insulating film being lower than a first flow rate of the first source gas in the forming the first insulating film; and
 a second film forming temperature in the forming the second insulating film being lower than a fir film forming temperature in the forming the first insulating film, the first insulating film has a part provided between the semiconductor layer and the source electrode and a part provided between the semiconductor layer and the drain electrode, and the second insulating film has a part provided between the semiconductor layer and the source electrode and a part provided between the semiconductor layer and the drain electrode.

* * * * *